US011711101B2

(12) United States Patent
Kimura

(10) Patent No.: US 11,711,101 B2
(45) Date of Patent: Jul. 25, 2023

(54) COMMUNICATION DEVICE AND COMMUNICATION METHOD

(71) Applicant: SONY GROUP CORPORATION, Tokyo (JP)

(72) Inventor: Ryota Kimura, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 41 days.

(21) Appl. No.: 17/427,978

(22) PCT Filed: Jan. 6, 2020

(86) PCT No.: PCT/JP2020/000031
§ 371 (c)(1),
(2) Date: Aug. 3, 2021

(87) PCT Pub. No.: WO2020/166229
PCT Pub. Date: Aug. 20, 2020

(65) Prior Publication Data
US 2022/0131559 A1    Apr. 28, 2022

(30) Foreign Application Priority Data
Feb. 13, 2019  (JP) ................. 2019-023995

(51) Int. Cl.
H03M 13/25 (2006.01)
H04L 1/00 (2006.01)
H04W 8/24 (2009.01)

(52) U.S. Cl.
CPC ....... H03M 13/251 (2013.01); H03M 13/255 (2013.01); H04L 1/0068 (2013.01); H04L 1/0071 (2013.01); H04W 8/24 (2013.01)

(58) Field of Classification Search
CPC ... H04L 1/0009; H04L 1/0041; H04L 1/0045; H04L 1/0057; H04L 1/0068;
(Continued)

(56) References Cited

U.S. PATENT DOCUMENTS 10,541,780 B2 * 1/2020 Mukkavilli ........... H04L 1/0045
2010/0218066 A1   8/2010 Okamura et al.
(Continued)

FOREIGN PATENT DOCUMENTS

CN   101765977 A   6/2010
CN   103918209 A   7/2014
(Continued)

OTHER PUBLICATIONS

Zhang, A layer-mixed FEC scheme for scalable media transmission over mobile TV services, IEEE, pp. 309-320. (Year: 2016).*
(Continued)

Primary Examiner — Shelly A Chase
(74) Attorney, Agent, or Firm — Chip Law Group

(57) ABSTRACT

A communication device that applies an error in an upper layer in addition to error correction in a physical layer is provided. The communication device includes an acquisition unit that acquires control information regarding forward error correction (FEC) of an upper layer and control information regarding FEC of a lower layer, an encoding-decoding unit that performs error correction encoding or decoding of an information sequence in the upper layer according to control information regarding the FEC of the upper layer, and a puncturing processing unit that performs puncturing or depuncturing in the upper layer. The information sequence after FEC encoding of the upper layer is divided into blocks, and puncturing and interleaving are performed in units of blocks.

20 Claims, 26 Drawing Sheets

(58) Field of Classification Search
CPC .... H04L 1/0071; H04L 1/0075; H03M 13/25; H03M 13/27; H03M 13/251; H03M 13/6306; H03M 13/6362
See application file for complete search history.

(56) References Cited

U.S. PATENT DOCUMENTS

| | | | |
|---|---|---|---|
| 2011/0296275 A1* | 12/2011 | Kishigami | H04L 1/0009 |
| | | | 714/755 |
| 2013/0117638 A1 | 5/2013 | Yang et al. | |
| 2018/0048421 A1 | 2/2018 | Yeo et al. | |
| 2018/0092104 A1 | 3/2018 | Sheng et al. | |

FOREIGN PATENT DOCUMENTS

| | | |
|---|---|---|
| CN | 107733565 A | 2/2018 |
| CN | 108401242 A | 8/2018 |
| CN | 110199484 A | 9/2019 |
| EP | 2173035 A1 | 4/2010 |
| EP | 2385644 A1 | 11/2011 |
| EP | 3282615 A1 | 2/2018 |
| EP | 3358898 A1 | 8/2018 |
| JP | 2007-503740 A | 2/2007 |
| JP | 2014-533032 A | 12/2014 |
| JP | 2017-038261 A | 2/2017 |
| JP | 2018-129801 A | 8/2018 |
| KR | 10-2013-0050875 A | 5/2013 |
| KR | 10-2018-0018188 A | 2/2018 |
| WO | 2005/022814 A1 | 3/2005 |
| WO | 2009/016825 A1 | 2/2009 |
| WO | 2010/087197 A1 | 8/2010 |
| WO | 2013/069983 A1 | 5/2013 |

OTHER PUBLICATIONS

Jenkae et al., Preamble-layer receiver for reliable multicast transmission in wireless systems, IEEE pp. 1805-1811. (Year: 2005).*
International Search Report and Written Opinion of PCT Application No. PCT/JP2020/000031, dated Feb. 4, 2020, 11 pages of ISRWO.

* cited by examiner

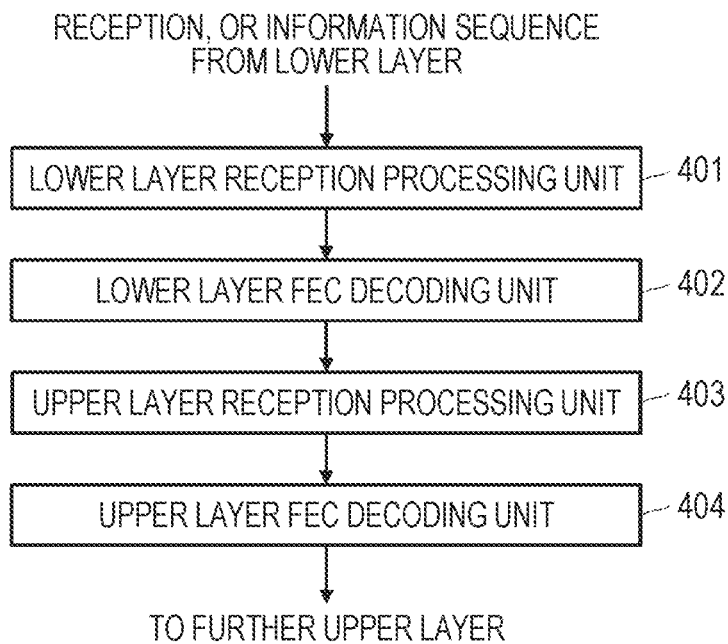
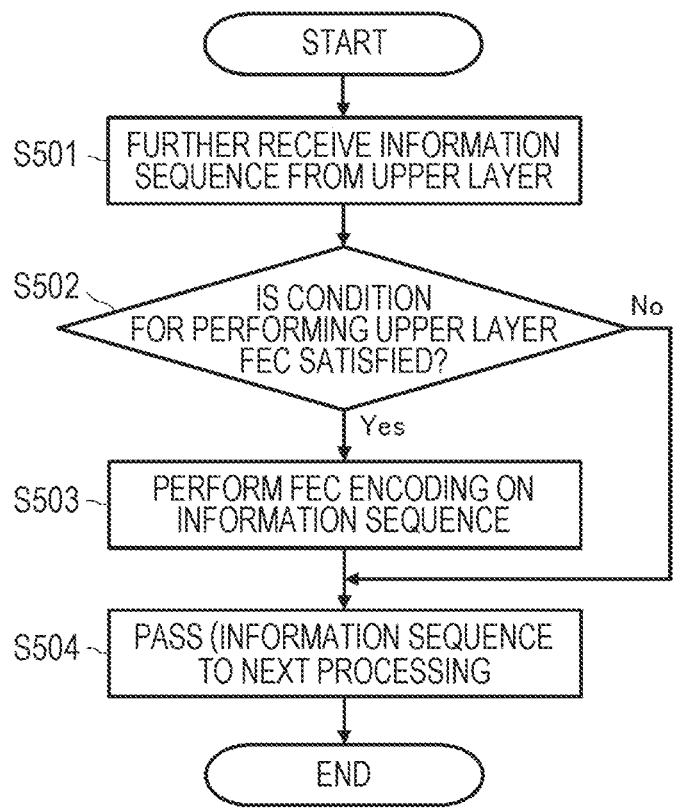

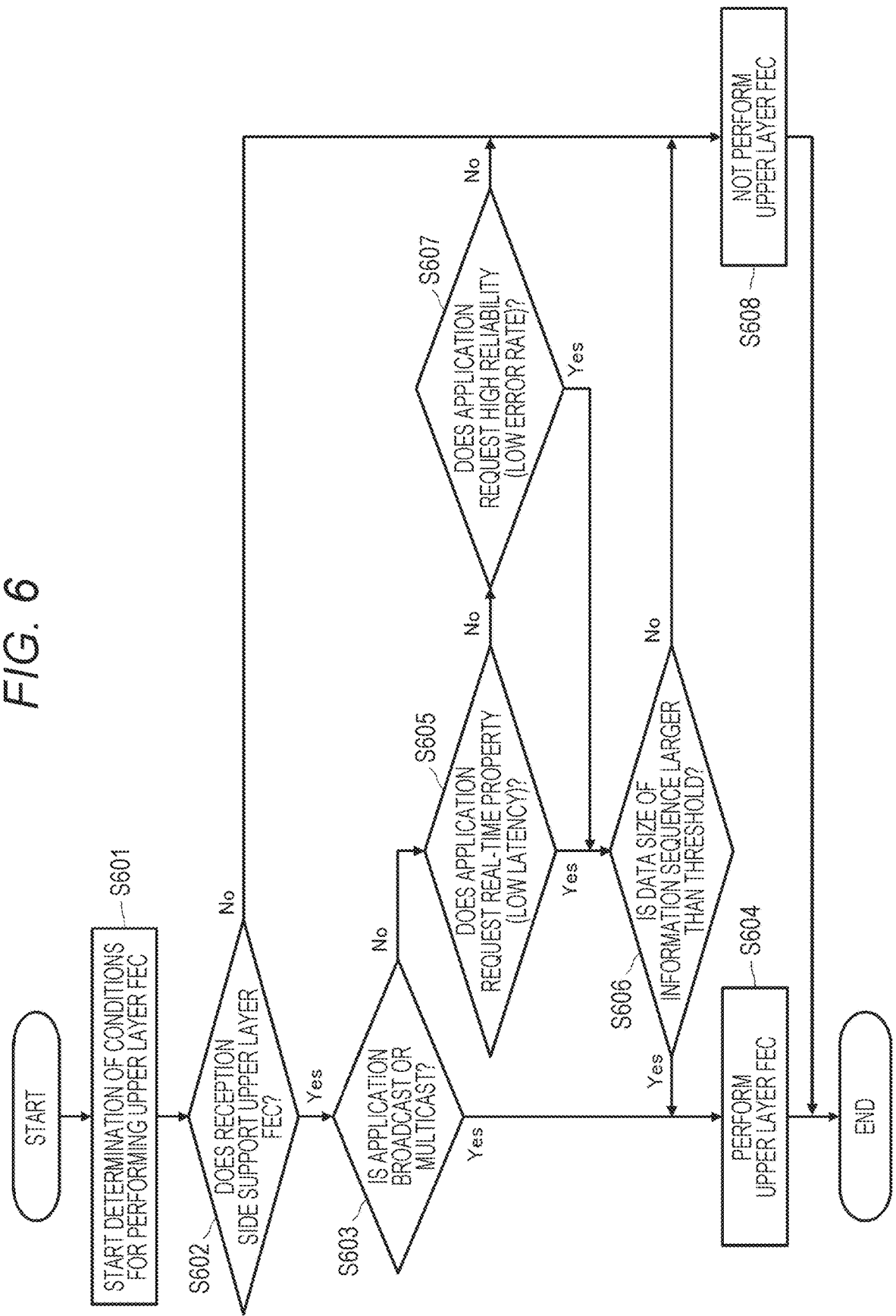

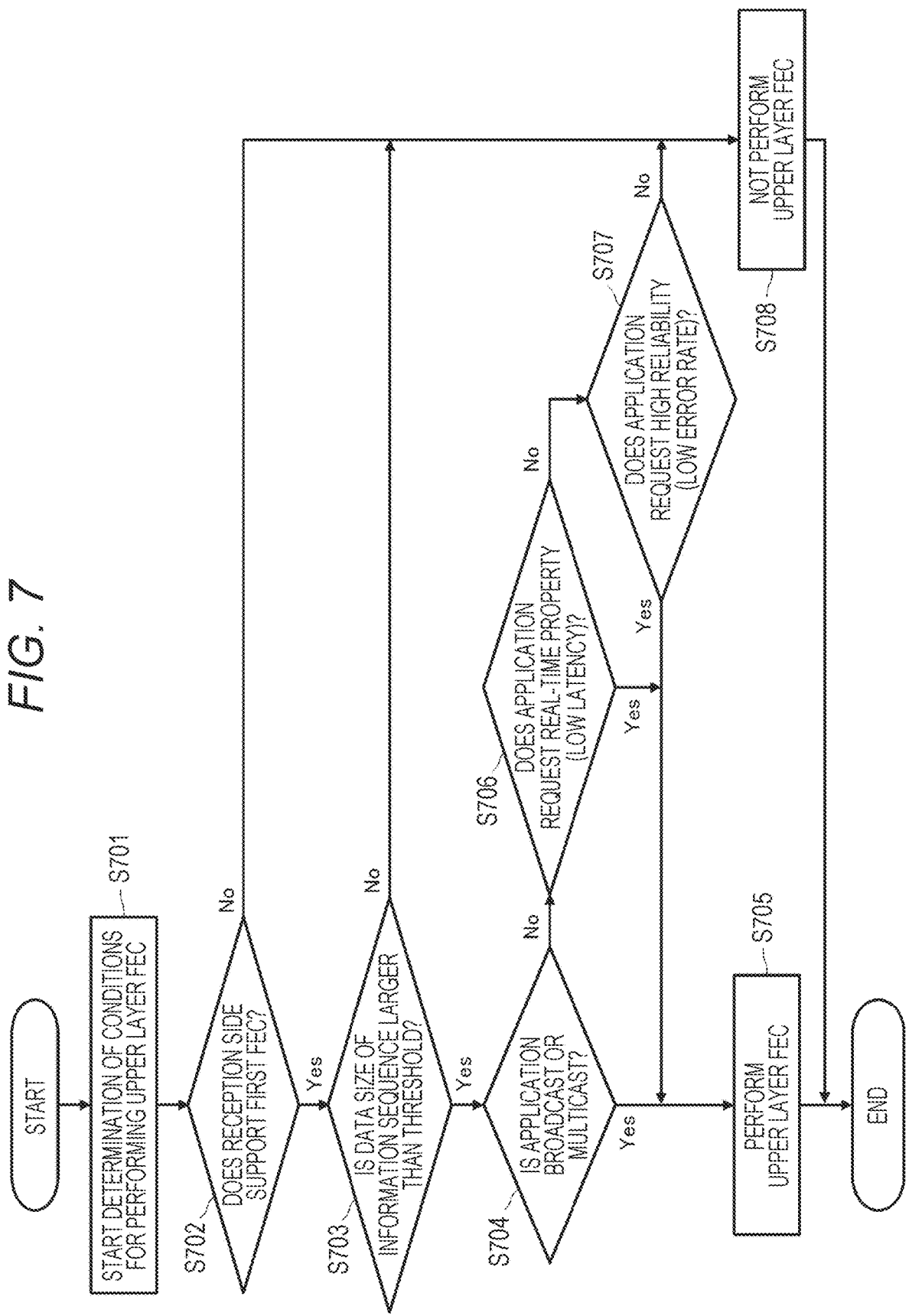

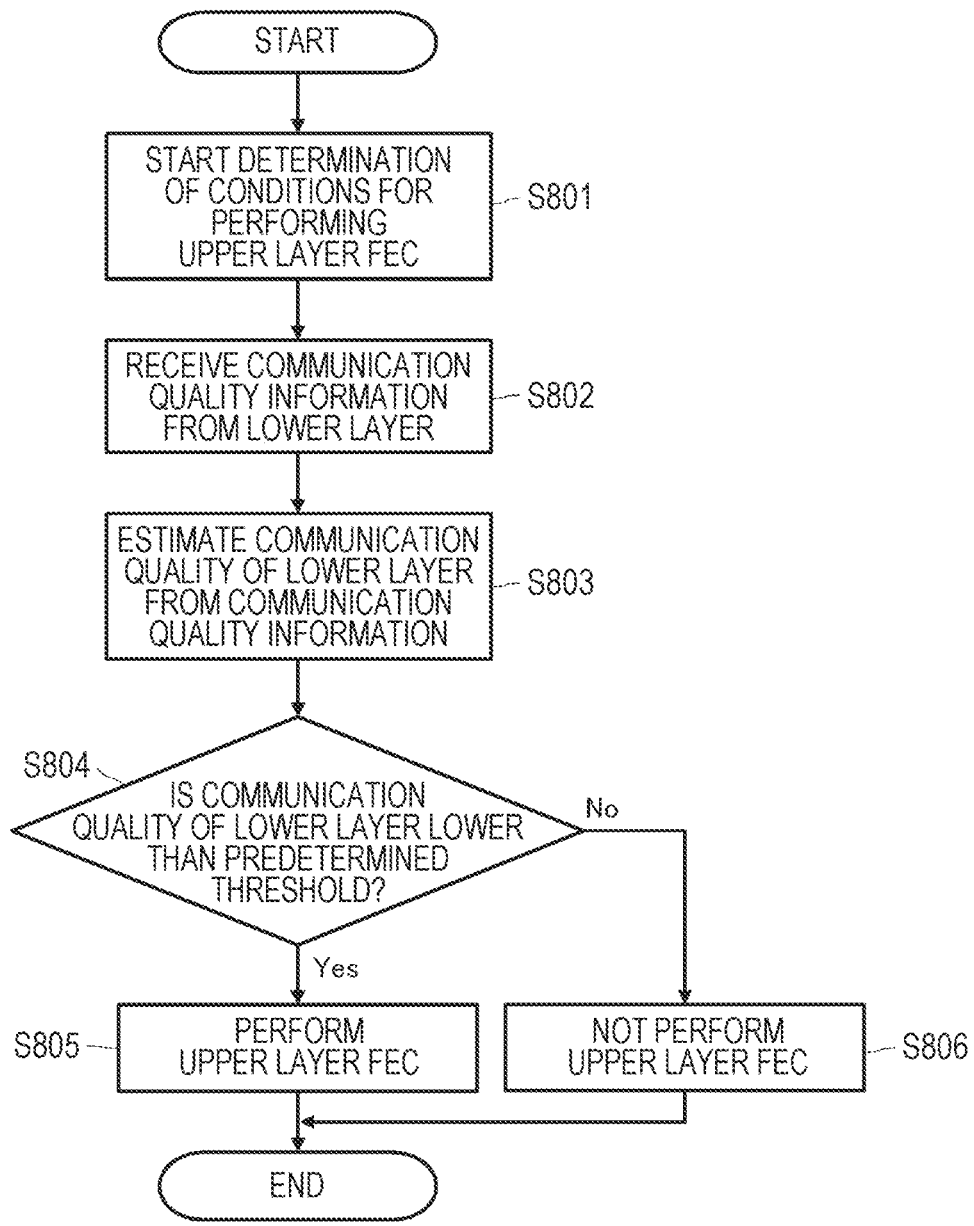

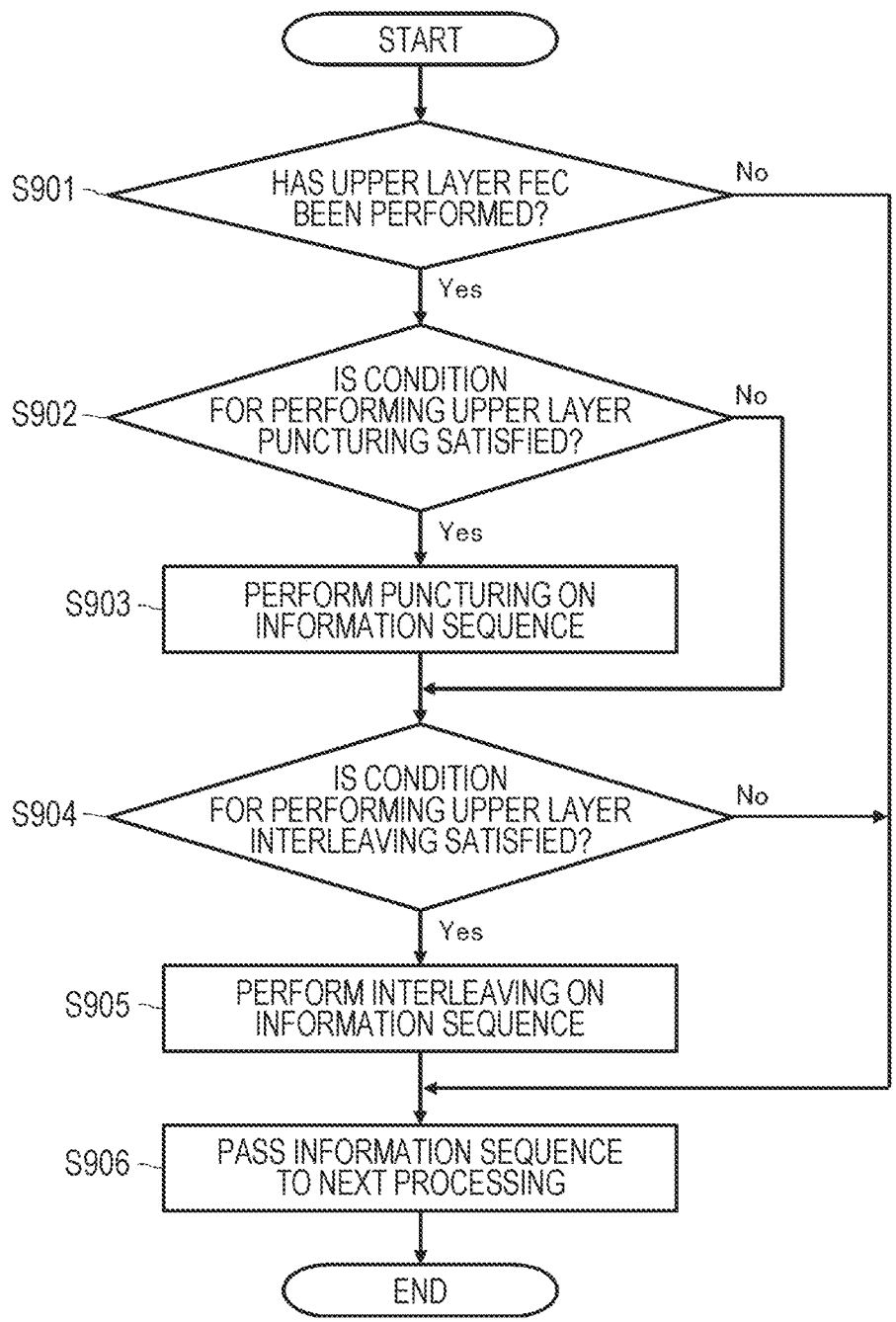

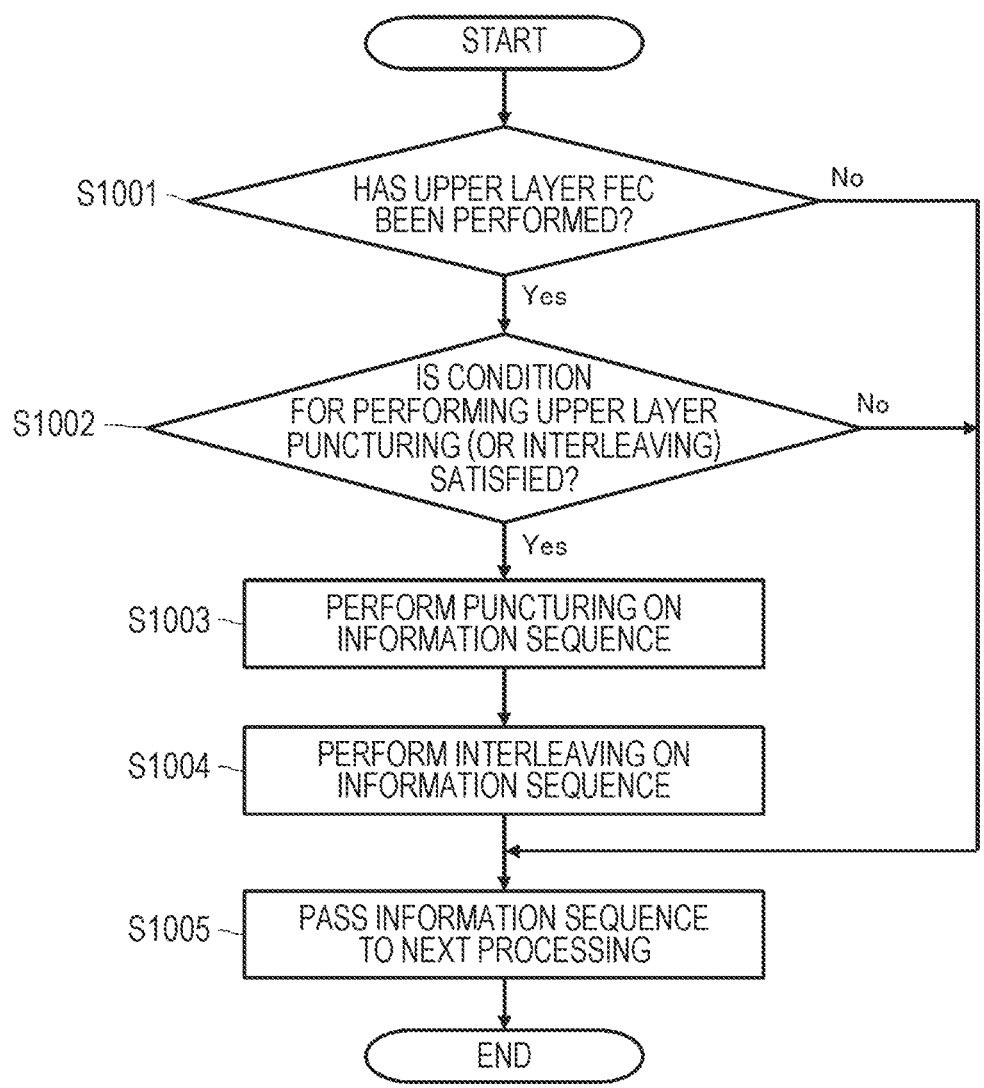

COMMUNICATION DEVICE AND COMMUNICATION METHOD

CROSS REFERENCE TO RELATED APPLICATIONS

This application is a U.S. National Phase of International Patent Application No. PCT/JP2020/000031 filed on Jan. 6, 2020, which claims priority benefit of Japanese Patent Application No. JP 2019-023995 filed in the Japan Patent Office on Feb. 13, 2019. Each of the above-referenced applications is hereby incorporated herein by reference in its entirety.

TECHNICAL FIELD

The technology disclosed in the present description relates to a communication device and a communication method for transmitting and receiving radio signals.

BACKGROUND ART

Error correction technique is important in ensuring reliability of digital communication, and for example, error correction is performed in a physical layer. Forward error correction (FEC) technique performed in a layer other than the physical layer (layer 1: L1) (for example, a data link layer (layer 2: L2), a network layer (layer 3: L3), a transport layer (layer 4: L4), a session layer (layer 5: L5), a presentation layer (layer 6: L6), an application layer (layer 7: L7), or the like) is known in this industry. Furthermore, an information processing device to which the FEC (Layer 2 FEC, L2-FEC) is applied in a wireless local area network (LAN) layer 2 has also been proposed (see Patent Document 1).

Furthermore, in the field of wireless communication, it is common to apply an error correction technique including hybrid automatic repeat request (hybrid ARQ (HARQ)) in the physical layer (L1). For example, in a wireless local area network (LAN) system, a convolutional code, a low density parity-check (LDPC) code, or the like is used. Also in a cellular system, any error correction technique such as a convolutional code, a turbo code, an LDPC code, and a polar code is used, and moreover, the HARQ is also used. Thus, it is attempted to ensure quality necessary for a wireless section while coping with the state of a wireless radio wave transmission path and interference and fluctuation thereof.

Patent Document 1 discloses exchange between the layer 2 and an upper layer thereof, but does not particularly mention a technique of L2-FEC in consideration of the state of a physical layer. In particular, puncturing in the layer 2 is not mentioned. Therefore, in a case where it is desired to perform communication in a wireless section with a large fluctuation, there is a concern that a sufficient effect cannot be obtained by the technique described in Patent Document 1.

CITATION LIST

Patent Document

Patent Document 1: Japanese Patent Application Laid-Open No. 2017-38261

SUMMARY OF THE INVENTION

Problems to be Solved by the Invention

An object of the technology disclosed in the present description is to provide a communication device and a communication method that perform error correction.

Solutions to Problems

The technology disclosed in the present description has been made in view of the above object, and a first aspect thereof is a communication device including:

an acquisition unit that acquires control information regarding forward error correction (FEC) of an upper layer and control information regarding FEC of a lower layer, an encoding-decoding unit that performs error correction encoding or decoding of an information sequence in the upper layer according to control information regarding the FEC of the upper layer, and a puncturing processing unit that performs puncturing or depuncturing in the upper layer.

The communication device according to the first aspect further includes a division processing unit that divides the information sequence of the upper layer into blocks or concatenates blocks. Then, the puncturing processing unit performs puncturing or depuncturing in units of the divided blocks. Furthermore, the communication device according to the first aspect further includes an interleave processing unit that performs interleaving or deinterleaving in the upper layer in units of the divided blocks.

Furthermore, a second aspect of the technology disclosed in the present description is a communication method including:

an acquisition step of acquiring control information regarding forward error correction (FEC) of an upper layer and control information regarding FEC of a lower layer;

an encoding-decoding step of performing error correction encoding or decoding of an information sequence in the upper layer according to control information regarding the FEC of the upper layer; and a puncturing processing step of performing puncturing or depuncturing in the upper layer.

Effects of the Invention

According to the technology disclosed in the present description, it is possible to provide a communication device and a communication method that apply an error in an upper layer in addition to error correction in a physical layer, and perform puncturing on an error correction encoded information sequence in the upper layer.

Note that effects described in the present description are merely examples, and the effects of the present technology are not limited thereto. Furthermore, in addition to the above-described effects, the present invention may further exhibit additional effects.

Other objects, features, and advantages of the technology disclosed in the present description will become apparent from a detailed description based on embodiments described below and the accompanying drawings.

BRIEF DESCRIPTION OF DRAWINGS

FIG. 4 is a diagram illustrating a functional configuration example of a signal processing unit on a reception side.

FIG. 5 is a flowchart illustrating a processing procedure for determining whether or not to perform FEC in the upper layer.

FIG. 6 is a flowchart illustrating a processing procedure for determining whether or not to perform upper layer FEC encoding.

FIG. 7 is a flowchart illustrating another example of a processing procedure for determining whether or not to perform the upper layer FEC encoding.

FIG. 8 is a flowchart illustrating a processing procedure for determining whether or not to perform the upper layer FEC encoding on the basis of communication quality of the lower layer.

FIG. 9 is a flowchart illustrating a processing procedure for determining whether or not to perform puncturing and interleaving in the upper layer on the transmission side.

FIG. 10 is a flowchart illustrating another example of a processing procedure for determining whether or not to perform the puncturing and the interleaving in the upper layer on the transmission side.

MODE FOR CARRYING OUT THE INVENTION

Hereinafter, embodiments of the technology disclosed in the present description will be described in detail with reference to the drawings.

A. System Configuration

Figure 1:
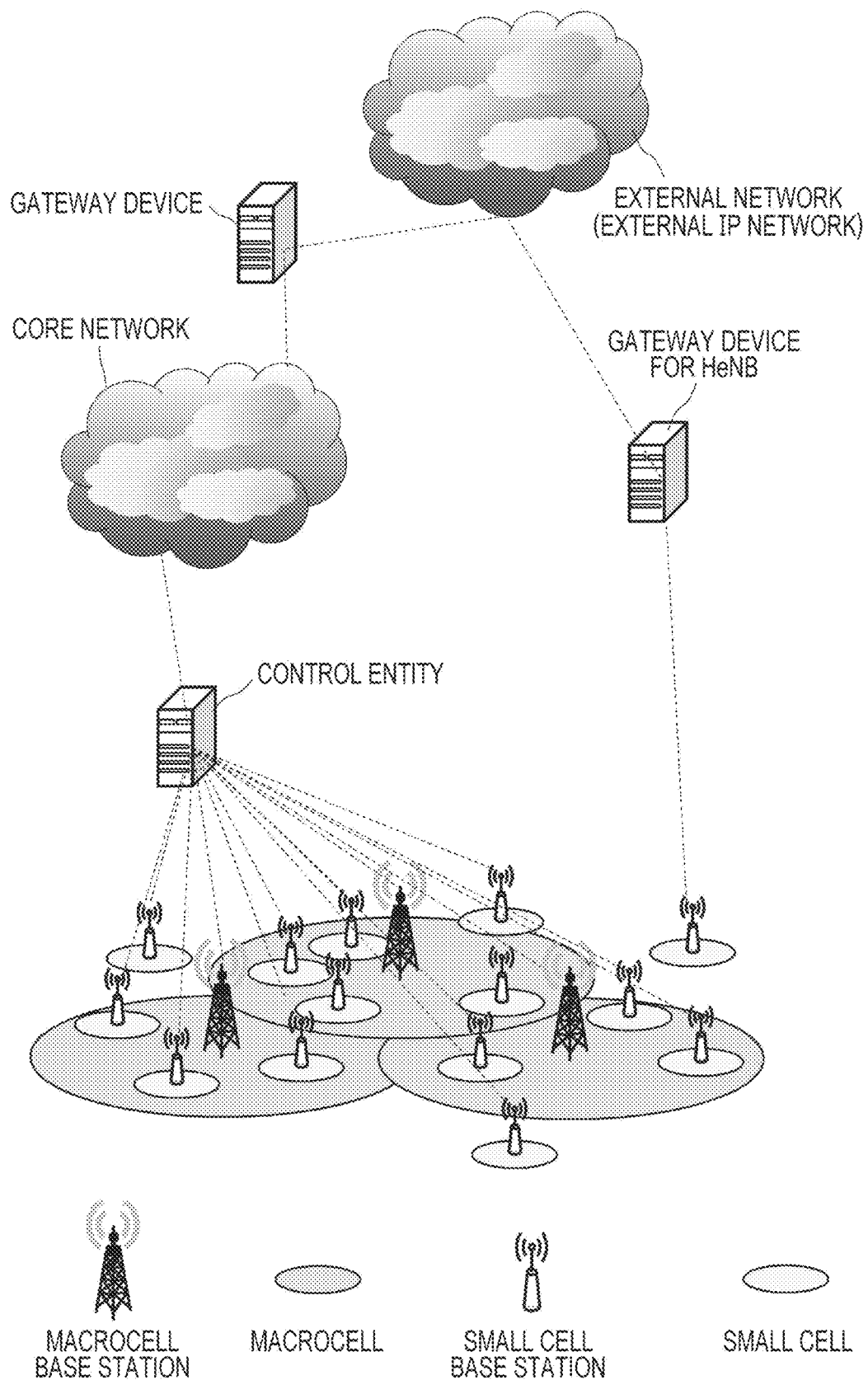
FIG. 1 is a diagram illustrating a configuration example of a communication system.

FIG. 1 illustrates a configuration example of a communication system to which the technology disclosed in the present description can be applied. In the diagram, lines between communication devices are indicated by broken lines. The communication device includes a base station (microcell base station, small cell base station), a control entity, a gateway device, and the like. Note that the lines mentioned here mean logical connections, and are not necessarily directly connected physically.

The communication area provided by the communication system is formed by a "cell" in which each of a plurality of base stations provides a service. In FIG. 1, the cell is drawn in an ellipse. One base station may provide a plurality of cells. As the base station, a macrocell base station serving in a macrocell area and a small cell base station serving in a small cell area can be mentioned.

The small cell area is basically disposed so as to overlap with the macrocell area. However, the small cell area may exist partially or completely outside the macrocell area. A plurality of small cell base stations may constitute a group (cluster). Furthermore, a base station having a role of a cluster head may be provided in the cluster.

The macrocell and the small cell may have characteristics in a radio resource to be used. For example, same frequency resources F1 or same time resources T1 may be used in the macrocell and the small cell. In this way, it is possible to improve utilization efficiency of radio resources as the entire communication system. On the other hand, the macrocell may use a frequency resource F1 or a time resource T1, and the small cell may use a frequency resource F2 or a time resource T2. Thus, it is possible to avoid interference between the macrocell and the small cell. Moreover, the frequency resources F1 and F2 or the time resources T1 and T2 may be used by both the macrocell and the small cell. In particular, when applied to frequency resources, the concept is equivalent to carrier aggregation (CA).

The base stations can communicate with each other via a backhaul, and mainly exchange control information. The topology of the backhaul between the base stations may be a mesh type, a star type, a ring type, or other types. Furthermore, the backhaul may connect the base stations and a core network via an external network. The backhaul may be wired or wireless. The backhaul may employ, for example, exchange of information using a protocol of an X2 interface or an S1 interface.

Furthermore, the base station also has the backhaul with the core network of the communication system. As illustrated, the communication system may connect with the core network via a connection with a control entity. The control entity can also be regarded as one of the elements of the core network. Furthermore, the base station may be connected to the core network via an external network in addition to the control entity. For example, the communication system is connected to the external network via a femtocell base station device or a home eNodeB (HeNB) device that can be installed indoors or at home.

B. FEC of Lower Layer and Upper Layer

In the communication system according to the present embodiment, FEC is applied to a plurality of layers of a lower layer (Lower Layer) and an upper layer (Upper Layer or Higher Layer). The FEC applied in each layer is lower layer FEC (LL-FEC), upper layer FEC (UL-FEC), higher layer FEC (HL-FEC), L1-FEC, L2-FEC, . . . , L7-FEC, physical layer FEC (PHY-FEC), datalink layer FEC (DL-FEC), media access control layer FEC (MAC-FEC), radio link control layer FEC (RLC-FEC), packet date convergence protocol layer FEC (PDCP-FEC), network layer FEC (NL-FEC), transport layer FEC (TL-FEC), session layer FEC (SL-FEC), presentation layer FEC (PL-FEC), application layer FEC (AL-FEC), or the like.

Figure 2:
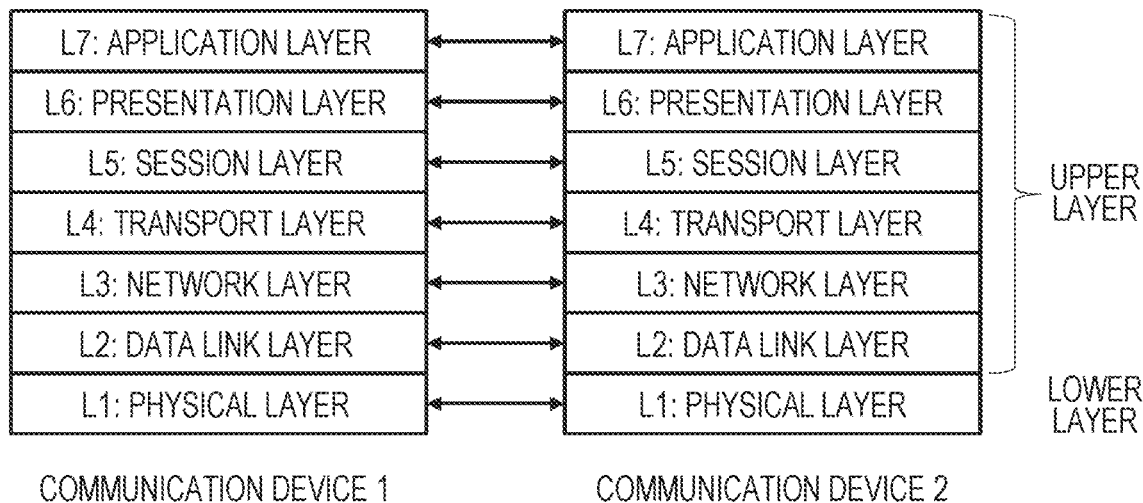
FIG. 2 is a diagram illustrating an example of a hierarchical model and positioning of a lower layer and an upper layer.

FIG. 2 illustrates an example of a hierarchical model assumed in the communication system according to the present embodiment and positioning of the lower layer and the upper layer. As the lower layer, a physical layer is assumed. Furthermore, at least one of L2 to L7 is assumed for the upper layer. In the present embodiment, from the viewpoint of performing control in view of the state of the physical layer, it can be said that it is desirable to assume L2 as the upper layer.

Figure 3:
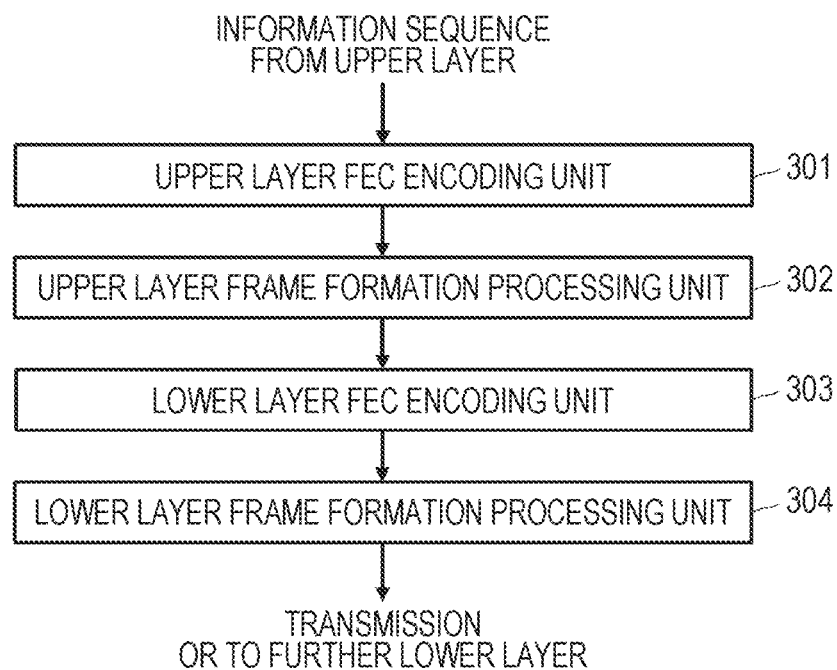
FIG. 3 is a diagram illustrating a functional configuration example of a signal processing unit on a transmission side.

FIG. 3 illustrates a functional configuration example of a signal processing unit on a transmission side in the communication system according to the present embodiment. Furthermore, FIG. 4 illustrates a functional configuration example of a signal processing unit on a reception side in the communication system according to the present embodiment. In the present embodiment, an error correction code (FEC) is applied to an information sequence as a target of transmission and reception in the lower layer and the upper layer. Note that, although only related blocks of the upper layer and the lower layer are illustrated in each drawing, processing of still another layer (a layer that does not contribute to the technology disclosed in the present description) between the target upper layer and lower layer may also exist in each of transmission and reception.

First, referring to FIG. 3, in the upper layer on the transmission side, an upper layer FEC encoding unit 301 performs FEC encoding on the information sequence (bit sequence, frame) that has further come down from the upper layer. For FEC in the upper layer by the upper layer FEC encoding unit 301, it is desirable to apply the FEC belonging to types of FEC codes having a capability of erasure correction (erasure correction codes (Erasure Codes), rateless codes (Rateless Codes), fountain codes (Fountain Codes)). Table 1 below describes examples of FEC codes that are desirable to be used in the upper layer. In the upper layer FEC encoding unit 301, in addition to encoding of these codes, encoding for error detection (or addition of a parity code) such as cyclic redundancy check (CRC) may be added.

TABLE 1

Example of first FEC code

Erasure correction code
Rateless code
Fountain code
Tornade code
LT code
Raptor code
RaptorQ code
LDPC code
BCH code
RS code
XOR code After the FEC encoding in the upper layer, an upper layer frame formation processing unit 302 performs frame formation processing in the upper layer. In the present embodiment, the upper layer frame formation processing unit 302 performs at least one of the following processes (a) to (c) on the information sequence after encoding of the upper layer.

(a) Divide information sequence into plurality (segmentation, packetization, framing)
  division into equal sizes,
  division into unequal sizes
(b) Puncturing of information sequence (removing specific part of encoded information sequence (not passing to the lower layer))
  puncturing in units of bits (or bytes)
  puncturing in above divided units (segments, packets, frames)
(c) Interleaving of information sequence after encoding (interleaving or ordering)
  interleaving in units of bits (or in units of bytes) in same sequence
  interleaving in divided units in same sequence
  interleaving in units of bits (or bytes) between different sequences
  interleaving divided units between different sequences Details of the upper layer frame formation processing will be described later. However, in the present embodiment, it is to be sufficiently understood that the puncturing and the interleaving are performed in units of blocks after error correction encoding in the divided upper layer.

When the upper layer frame formation processing on the transmission side is completed, the information sequence is passed to the lower layer. Then, in the present embodiment, the FEC encoding is also performed in the lower layer by the lower layer FEC encoding unit 303. Table 2 below illustrates an example of the FEC codes used in the lower layer FEC encoding unit 303. In the lower layer, the applicant considers that it is not particularly necessary to be FEC codes having the capability of erasure correction. Furthermore, although the LDPC codes are included in each of Table 1 and Table 2, they do not need to have exactly the same code design (for example, there may be a difference among categories of LDPC codes, such as a regular LDPC code having different generator matrices and generator polynomials, and being different in an irregular LDPC code).

TABLE 2

Example of second FEC code

Convolutional code
Turbo code
LDPC code
Polar code

When the FEC encoding in the lower layer by the lower layer FEC encoding unit 303 is completed, remaining processing of the target layer is performed by a lower layer frame formation processing unit 304. In a case where the lower layer is considered as a physical layer, after the lower layer FEC encoding, a signal is transmitted through coding rate adjustment (rate matching), bit interleaving or bit scrambling (Bit-Interleaving, Bit-Scrambling), complex signal point mapping (modulation mapping, bit-to-complex constellation mapping), digital transmission processing for multiple-input multiple-output (MIMO, multi-antenna) (spatial layer mapping, precoding, digital beamforming), radio resource arrangement (resource element mapping), waveform shaping (waveform shaping, waveform modulation, inverse fast Fourier transform (IFFT), inverse discrete Fourier transform (IDFT), filtering, windowing)), digital-to-analog (DA) conversion, frequency conversion (up-conversion), analog transmission processing for MIMO (analog beamforming), and the like.

Subsequently, referring to FIG. 4, first, reception processing is performed in a lower layer reception processing unit 401. In a case where the lower layer is considered as a physical layer, an information sequence (soft bit sequence) is passed to a lower layer FEC decoding unit 402 through analog reception processing for MIMO, frequency conversion (down-conversion), analog-to-digital (AD) conversion, waveform demodulation (waveform demodulation), fast Fourier transform (FFT), discrete Fourier transform (DFT)), radio resource selection (resource element extraction, resource element de-mapping), channel equalization (channel equalization, channel estimation, MIMO decomposition, MIMO equalization), soft bit generation (demodulation, complex-to-soft-bit constellation de-mapping, log-likelihood ratio (LLR) generation, soft information, and soft-decision information), bit deinterleaving or bit descrambling (bit-deinterleaving, bit-descrambling), coding rate adjustment (rate de-matching), and the like.

The lower layer FEC decoding unit 402 performs FEC decoding according to the FEC code used in the transmission side lower layer. The lower layer FEC decoding unit 402 further performs error detection processing such as CRC. Thus, in a case where no error is detected in the lower layer, the received and decoded information sequence is passed to the upper layer. In a case where an error is detected, if an automatic repeat request (ARQ) or the hybrid automatic repeat request (HARQ) is used together, retransmission control corresponding thereto is performed. In a case where the retransmission control is not used, a notification indicating that an error has occurred in the target information sequence is sent to the upper layer.

An upper layer reception processing unit 403 on the reception side performs a frame formation processing on the information sequence (in a case where division processing has been performed on the upper layer transmission side, a plurality of division unit blocks) received from the lower layer. In the frame formation processing on the reception side, at least one of the following processes (a) to (c) is performed in a corresponding form on the transmission side.

(a) Concatenation of divided segments, packets, frames, and the like.

(b) Depuncturing of the information sequence (inserting predetermined value (for example, value of zero) into a specific partial section of the received information sequence)
  depuncturing in units of bits (or in units of bytes)
  depuncturing in the above divided units (segments, packets, frames)

(c) Deinterleaving the information sequence (deinterleaving or re-ordering)
  deinterleaving in units of bits (or in units of bytes) in the same sequence
  deinterleaving in divided units in the same sequence
  deinterleaving in bits (or bytes) between different sequences
  deinterleaving divided units between different sequences Details of reception processing in the upper layer will be described later. However, in the present embodiment, it is to be sufficiently understood that the depuncturing and the deinterleaving are performed in units of blocks after error correction encoding in the divided upper layer corresponding to the upper layer frame formation processing on the transmission side.

After the upper layer reception processing on the reception side is completed, an upper layer FEC decoding unit 404 executes upper layer FEC decoding on the information sequence after processing. In a case where an error has been corrected by the upper layer FEC decoding (in a case where no error is detected by the CRC), the information sequence after decoding is further passed to the upper layer. In a case where an error has not been corrected (when the error has been detected by the CRC), retransmission control (ARQ) in the upper layer is performed.

C. Upper Layer Processing

In this section, processing in the upper layer will be described in detail.

C-1. Determination of Whether or not to Perform Upper Layer FEC

In the present embodiment, the upper layer FEC can be applied to all information sequences to be transmitted and received. Alternatively, a condition may be set, and the upper layer FEC may be performed only when the condition is satisfied.

FIG. 5 illustrates a processing procedure for determining whether or not to perform the FEC in the upper layer on the transmission side in the form of a flowchart. On the transmission side, upon further receiving the information sequence from the upper layer (step S501), the upper layer FEC encoding unit 301 checks whether or not a condition for performing the upper layer FEC is satisfied (step S502). Then, in a case where the condition for performing the upper layer FEC is satisfied (Yes in step S502), the upper layer FEC encoding unit 301 performs FEC encoding on the information sequence received in step S501 (step S503). Then, the upper layer FEC encoding unit 301 passes the information sequence encoded by the upper layer FEC encoding to the next processing (upper layer frame formation processing unit 302) (step S504), and ends this processing. Furthermore, in a case where the condition for performing the upper layer FEC is not satisfied (No in step S502), the upper layer FEC encoding processing (step S503) is skipped, the information sequence is passed to the next processing (upper layer frame formation processing unit 302) (step S504), and this processing is terminated.

FIG. 6 illustrates a detailed processing procedure for determining whether or not to perform the upper layer FEC encoding, which is performed in step S502 in the flowchart illustrated in FIG. 5, in the form of a flowchart. The illustrated processing procedure is performed by, for example, the upper layer FEC encoding unit 301 in the transmission side communication device.

Upon starting determination of conditions for performing the upper layer FEC (step S601), the upper layer FEC encoding unit 301 first checks whether or not a reception side communication device supports the upper layer FEC (step S602). In a case where the transmission side communication device transmits data to a plurality of communication devices, whether or not all reception side communication devices support the upper layer FEC is checked.

In a case where any one of the reception side communication devices does not support the upper layer FEC (No in step S602), the upper layer FEC encoding unit 301 determines not to perform the upper layer FEC (step S608), and ends this processing.

In a case where all the reception side communication devices support the upper layer FEC (Yes in step S602), the upper layer FEC encoding unit 301 subsequently checks whether or not an application of the target information sequence is broadcast or multicast (step S603). In a case where the application of the target information sequence is broadcast or multicast (Yes in step S603), the upper layer FEC encoding unit 301 determines to perform the upper layer FEC (step S604), and ends this processing.

On the other hand, in a case where the application of the target information sequence is neither broadcast nor multicast (No in step S603), the upper layer FEC encoding unit 301 subsequently checks whether or not the application of the target information sequence (QCI: Quality of Service (QoS) Class Indicator) requests a real-time property (or low latency) (step S605).

In a case where the application (QCI) of the target information sequence requests the real-time property (low latency) (Yes in step S605), the upper layer FEC encoding unit 301 subsequently checks whether or not the data size of the target information sequence is larger than a predetermined threshold (step S606).

Furthermore, in a case where the application (QCI) of the target information sequence does not request the real-time property (low latency) (No in step S605), the upper layer FEC encoding unit 301 further checks whether or not the application (QCI) of the target information sequence requests high reliability (low error rate) (step S607). In a case where the application (QCI) of the target information sequence requests the high reliability (low error rate) (Yes in step S607), the upper layer FEC encoding unit 301 subsequently checks whether or not the data size of the target information sequence is larger than the predetermined threshold (step S606).

In a case where the data size of the target information sequence is larger than the predetermined threshold (Yes in step S606), the upper layer FEC encoding unit 301 determines to perform the upper layer FEC (step S604), and ends this processing.

Furthermore, in a case where the data size of the target information sequence is equal to or less than the predetermined threshold (No in step S606), or in a case where the application (QCI) of the target information sequence does not request the high reliability (low error rate) (No in step S607), the upper layer FEC encoding unit 301 determines not to perform the upper layer FEC (step S608), and ends this processing.

Furthermore, FIG. 7 illustrates another example of the processing procedure for determining whether or not to perform the upper layer FEC encoding, which is performed in step S502 in the flowchart illustrated in FIG. 5, in the form of a flowchart. The illustrated processing procedure is performed by, for example, the upper layer FEC encoding unit 301 in the transmission side communication device.

When starting the determination of the conditions for performing the upper layer FEC (step S701), the upper layer FEC encoding unit 301 first checks whether or not the reception side communication device supports the upper layer FEC (step S702). In a case where the transmission side communication device transmits data to a plurality of communication devices, whether or not all reception side communication devices support the upper layer FEC is checked.

In a case where any one of the reception side communication devices does not support the upper layer FEC (No in step S702), the upper layer FEC encoding unit 301 determines not to perform the upper layer FEC (step S708), and ends this processing.

In a case where all the reception side communication devices support the upper layer FEC (Yes in step S702), the upper layer FEC encoding unit 301 subsequently checks whether or not the data size of the target information sequence is larger than a predetermined threshold (step S703).

In a case where the data size of the target information sequence is equal to or smaller than the predetermined threshold (No in step S703), the upper layer FEC encoding unit 301 determines not to perform the upper layer FEC (step S708), and ends this processing.

On the other hand, in a case where the data size of the target information sequence is larger than the predetermined threshold (Yes in step S703), the upper layer FEC encoding unit 301 subsequently checks whether or not the application of the target information sequence is broadcast or multicast (step S704). In a case where the application of the target information sequence is broadcast or multicast (Yes in step S704), the upper layer FEC encoding unit 301 determines to perform the upper layer FEC (step S705), and ends this processing.

Furthermore, in a case where the application of the target information sequence is neither broadcast nor multicast (No in step S704), the upper layer FEC encoding unit 301 further checks whether or not the application (QCI) of the target information sequence requests the real-time property (or low latency) (step S706). In a case where the application (QCI) of the target information sequence requests the real-time property (low latency) (Yes in step S706), the upper layer FEC encoding unit 301 determines to perform the upper layer FEC (step S705), and ends this processing.

In a case where the application (QCI) of the target information sequence does not request the real-time property (low latency) (No in step S706), the upper layer FEC encoding unit 301 further checks whether or not the application (QCI) of the target information sequence requests the high reliability (low error rate) (step S707). In a case where the application (QCI) of the target information sequence requests the high reliability (low error rate) (Yes in step S707), the upper layer FEC encoding unit 301 determines to perform the upper layer FEC (step S705), and ends this processing.

In a case where the application (QCI) of the target information sequence does not request the high reliability (low error rate) (No in step S707), the upper layer FEC encoding unit 301 determines not to perform the upper layer FEC (step S708), and ends this processing.

To summarize the processing procedures illustrated in FIGS. 6 and 7, the transmission side communication device determines whether or not to perform upper layer FEC encoding in view of the following conditions (i) to (iii).

(i) Status of reception side communication device
(ii) Application and requirement of target information sequence
(iii) Status of target information sequence The condition of the reception side communication device is that the reception side communication device supports the upper layer FEC. In a case of broadcast or multicast, unless "all" reception side communication devices support the upper layer FEC, there exists a reception side communication device by which decoding of the received information sequence is impossible. Thus, in a case where there is at least one reception side communication device that is not present for the upper layer FEC, it is desirable not to perform the upper layer FEC.

For the application and the requirement of the target information sequence, for example, in a case where the target application is broadcast or multicast, it is desirable to perform the upper layer FEC. In a case of broadcast or multicast, an error may occur only in the FEC of the physical layer (performed in the subsequent stage), and it is difficult to perform retransmission in that case. Therefore, by enhancing error correction capability by the upper layer FEC, it is possible to improve the reliability of broadcast and multicast.

Furthermore, it is desirable to perform the upper layer FEC also in a case where a target application requires the real-time property (low latency) and the high reliability (low error rate (a bit error rate (BER), a block error rate (BLER), a packet error rate (PER), a frame error rate (FER), and the like)). This is because the effect of reducing an error that cannot be removed by error correction of only the FEC of the physical layer and reducing delay due to retransmission control caused by the error can be expected by performing the upper layer FEC.

For the situation of the target information sequence, for example, in a case where the data size of the information sequence is larger than the predetermined size (bit depth or number of bytes) (or equal to or larger than the predetermined size), the upper layer FEC is performed. In a case where the size is smaller than the predetermined size, because there is a concern that the effect of the upper layer FEC, particularly an erasure correction code, becomes small, the influence of demerits of overhead (coding time on the transmission side, decoding time on the reception side, a notification of control information for the upper layer FEC, and the like) required for the upper layer FEC becomes large, and thus determining not to perform the upper layer FEC is desirable in some cases.

In the present embodiment, QCI can be considered as a requirement of the application. The QCI is a parameter that is associated with every target information sequence or every application, every session, or every bearer associated with the target information sequence, and is indicated such that communication quality (QoS) required when the information sequence is transmitted and received can be achieved. Table 3 below illustrates elements of QCI and conditions for determining whether or not to perform the upper layer FEC for each element.

TABLE 3

| Element of QCI | Specific content | Condition for performing first FEC |
| --- | --- | --- |
| Resource Type | GBR or Non-GBR | Perform when GBR is requested (or always perform first FEC) |
| Priority | High, Medium, Low | Perform when High or Medium (or always perform first FEC) |
| Reliability | Arrival rate of information sequence (100%-information sequence error rate) | Perform when reliability of 99.999% or higher is requested |
| Latency, Real-time | Delay time until passing information | Perform when delay time of 1 millisecond |

TABLE 3-continued

| Element of QCI | Specific content | Condition for performing first FEC |
| --- | --- | --- |
| | sequence from Layer 2 to Layer 3 Delay time of E2E (End-to-End) | or less is requested |

In the present embodiment, it is desirable to determine whether or not to perform the upper layer FEC particularly with respect to requirements of reliability and latency (real time). Alternatively, in addition to the reliability and the latency, whether or not to perform the upper layer FEC may be determined for a resource type (guaranteed bit rate (GBR), non-GBR) and the priority.

Furthermore, in the present embodiment, the upper layer FEC may be mapped to a bearer. For example, in a certain bearer, the same upper layer FEC encoding scheme, coding rate, block size, and the like are commonly used. In this way, it is possible to integrate the management and handling of quality conditions in units of bearers.

For the upper layer FEC, in addition to a mounting method of always performing, a mounting method of switching whether or not to perform the upper layer FEC according to the situation of the lower layer (physical layer) may be considered.

FIG. 8 illustrates a processing procedure for determining whether or not to perform the upper layer FEC encoding on the basis of communication quality of the lower layer in the form of a flowchart. The illustrated processing procedure is performed by, for example, the upper layer FEC encoding unit 301 in the transmission side communication device.

Upon starting determination of a condition for performing the upper layer FEC (step S801), the upper layer FEC encoding unit 301 first receives communication quality information from the lower layer (step S802).

Then, the upper layer FEC encoding unit 301 estimates the communication quality of the lower layer on the basis of the communication quality information received from the lower layer (step S803).

Here, in a case where the estimated communication quality of the layer is lower than a predetermined threshold (or the communication quality is worse than the predetermined threshold) (Yes in step S804), the upper layer FEC encoding unit 301 determines to perform the upper layer FEC (step S805), and ends this processing.

On the other hand, in a case where the estimated communication quality of the layer is equal to or higher than the predetermined threshold (No in step S804), the upper layer FEC encoding unit 301 determines not to perform the upper layer FEC (step S806), and ends this processing.

In the present embodiment, an error rate of the lower layer is used as the communication quality. The error rate of the lower layer can be estimated from ACK/NACK received from the lower layer. Then, in a case where the error rate of the lower layer has deteriorated or is worse than the predetermined error rate, the process proceeds to the branch Yes in processing step S804 in the flowchart illustrated in FIG. 8, and the upper layer FEC is performed (step S805). On the other hand, in a case where the error rate of the lower layer is good, it is not necessary to perform the upper layer FEC, and thus the processing proceeds to branch No in processing step S804.

Here, as the error rate, a bit error rate (BER), a transport block error rate (BLER), a divided block error rate, a packet error rate (PER), a frame error rate (FER), and the like can be mentioned. In particular, in the present embodiment, from the viewpoint of straddling layers, it is desirable to determine the communication quality of the lower layer on the basis of the error rate related to the communication quality of at least one of the BLER, the divided block error rate, the PER, or the FER.

C-2. Determination of Whether or not to Perform Puncturing in Upper Layer

FIG. 9 illustrates a processing procedure for determining whether or not to perform puncturing and interleaving in the upper layer on the transmission side in the form of a flowchart. The illustrated processing procedure is performed, for example, by the upper layer frame formation processing unit 302 in the transmission side communication device.

First, the upper layer frame formation processing unit 302 checks whether or not the upper layer FEC has been performed (step S901). In a case where the upper layer FEC has not been performed (No in step S901), the upper layer frame formation processing unit 302 passes the information sequence to the next processing (lower layer FEC encoding unit 303) without performing any of the puncturing and the interleaving in the upper layer (step S906), and ends this processing.

On the other hand, in a case where the upper layer FEC has been performed (Yes in step S901), the upper layer frame formation processing unit 302 subsequently checks whether or not a condition for performing upper layer puncturing is satisfied (step S902). Then, in a case where the condition for performing the upper layer puncturing is satisfied (Yes in step S902), the upper layer frame formation processing unit 302 performs puncturing on the information sequence (step S903). Furthermore, in a case where the condition for performing the upper layer puncturing is not satisfied (No in step S902), the upper layer frame formation processing unit 302 skips the puncturing in the upper layer.

Subsequently, it is checked whether or not a condition for performing the upper layer interleaving is satisfied (step S904). Then, in a case where the condition for performing the upper layer interleaving is satisfied (Yes in step S904), the upper layer frame formation processing unit 302 performs interleaving on the information sequence (step S905). Then, the information sequence is passed to the next processing (lower layer FEC encoding unit 303) (step S906), and this processing is ended.

Furthermore, in a case where the condition for performing the upper layer interleaving is not satisfied (No in step S904), the upper layer frame formation processing unit 302 passes the information sequence to the next processing (lower layer FEC encoding unit 303) without performing the interleaving in the upper layer (step S906), and ends this processing.

In the processing procedure illustrated in FIG. 9, it is assumed that an upper layer code is performed for the puncturing and the interleaving of the upper layer. This is because when depuncturing without the upper layer FEC code is performed, decoding is impossible on the reception side. Furthermore, it can be said that the interleaving is not effective (or the effect is low) in a case where the upper layer FEC code is not performed. In a case where the upper layer FEC code is performed and a case where the puncturing condition is satisfied (Yes in step S902), the upper layer frame formation processing unit 302 performs the puncturing (step S903). Furthermore, in a case where the upper layer FEC code is performed and a case where the interleaving condition is satisfied (Yes in step S904), the upper layer frame formation processing unit 302 performs the interleaving (step S905).

In the processing procedure illustrated in FIG. 9, each determination of performing the puncturing and the interleaving is performed independently. Furthermore, the determination and performing the puncturing and the interleaving are in any order, and unlike FIG. 9, the determination of performing interleaving may be performed first, and the determination of performing the puncturing may be performed subsequently.

FIG. 10 illustrates another example of a processing procedure for determining whether or not to perform the puncturing and the interleaving in the upper layer on the transmission side in the form of a flowchart. The illustrated processing procedure is performed, for example, by the upper layer frame formation processing unit 302 in the transmission side communication device.

First, the upper layer frame formation processing unit 302 checks whether or not the upper layer FEC has been performed (step S1001). In a case where the upper layer FEC has not been performed (No in step S1001), the upper layer frame formation processing unit 302 passes the information sequence to the next processing (lower layer FEC encoding unit 303) without performing either the puncturing or the interleaving in the upper layer (step S1006), and ends this processing.

On the other hand, in a case where the upper layer FEC has been performed (Yes in step S1001), the upper layer frame formation processing unit 302 subsequently checks whether or not a condition for performing the upper layer puncturing (or interleaving) is satisfied (step S1002).

Here, in a case where the condition for performing the upper layer puncturing (or interleaving) is satisfied (Yes in step S1002), the upper layer frame formation processing unit 302 performs the puncturing on the information sequence (step S1003), and subsequently performs the interleaving (step S1004). Then, the information sequence (after the puncturing is performed in the upper layer) is passed to the next processing (lower layer FEC encoding unit 303) (step S1005), and this processing is ended.

Furthermore, in a case where the condition for performing the upper layer puncturing (or interleaving) is not satisfied (No in step S1002), the upper layer frame formation processing unit 302 passes the information sequence to the next processing (lower layer FEC encoding unit 303) without performing either the puncturing or the interleaving on the information sequence (step S1005), and ends this processing.

In the processing procedure illustrated in FIG. 9, the determination of performing the upper layer puncturing and interleaving is performed independently, but in the processing procedure illustrated in FIG. 10, the determination of performing both the upper layer puncturing and interleaving is performed in one processing step.

Figure 11:
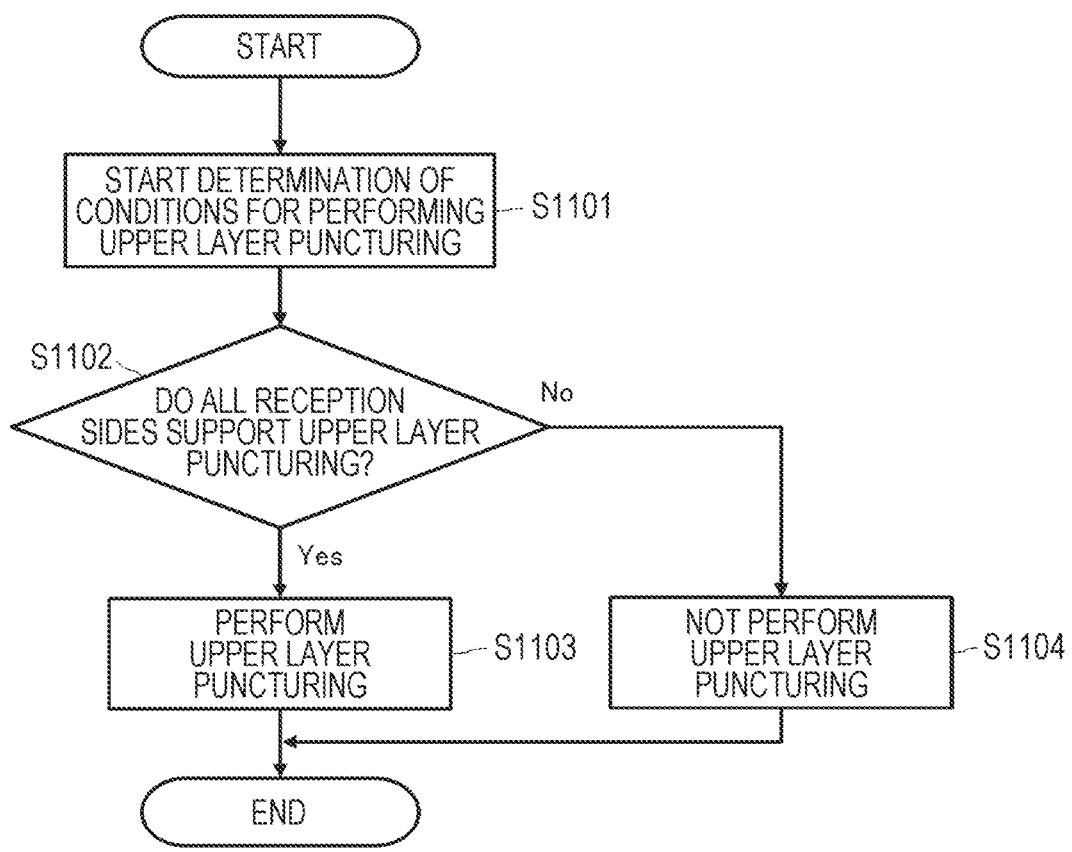
FIG. 11 is a flowchart illustrating a processing procedure for determining whether or not to perform upper layer puncturing.

FIG. 11 illustrates a processing procedure for determining whether or not to perform the upper layer puncturing in the form of a flowchart. The illustrated processing procedure is performed, for example, by the upper layer frame formation processing unit 302 in the transmission side communication device.

Upon starting the determination of a condition for performing the upper layer puncturing (step S1101), the upper layer frame formation processing unit 302 checks whether or not all the reception side communication devices support upper layer puncturing (step S1102).

In a case where all the reception side communication devices support the upper layer puncturing (Yes in step S1102), the upper layer frame formation processing unit 302 performs the upper layer puncturing (step S1103), and ends this processing.

On the other hand, in a case where any one of the reception side communication devices does not support the upper layer puncturing (No in step S1102), the upper layer frame formation processing unit 302 does not perform the upper layer puncturing (step S1104), and ends this processing.

Similarly to the processing of determining whether or not to perform the upper layer FEC encoding (see FIGS. 9 and 10), in a case where all the reception side communication devices support the upper layer puncturing including a case of the application of broadcast or multicast, it is possible to perform the upper layer puncturing. On the other hand, in a case where there is a device that does not support the upper layer puncturing among the reception side communication devices, the upper layer puncturing should not be performed.

Note that, by replacing "puncturing" in FIG. 11 with "interleaving", a processing procedure for determining whether or not to perform the upper layer interleaving can be made.

Figure 12:
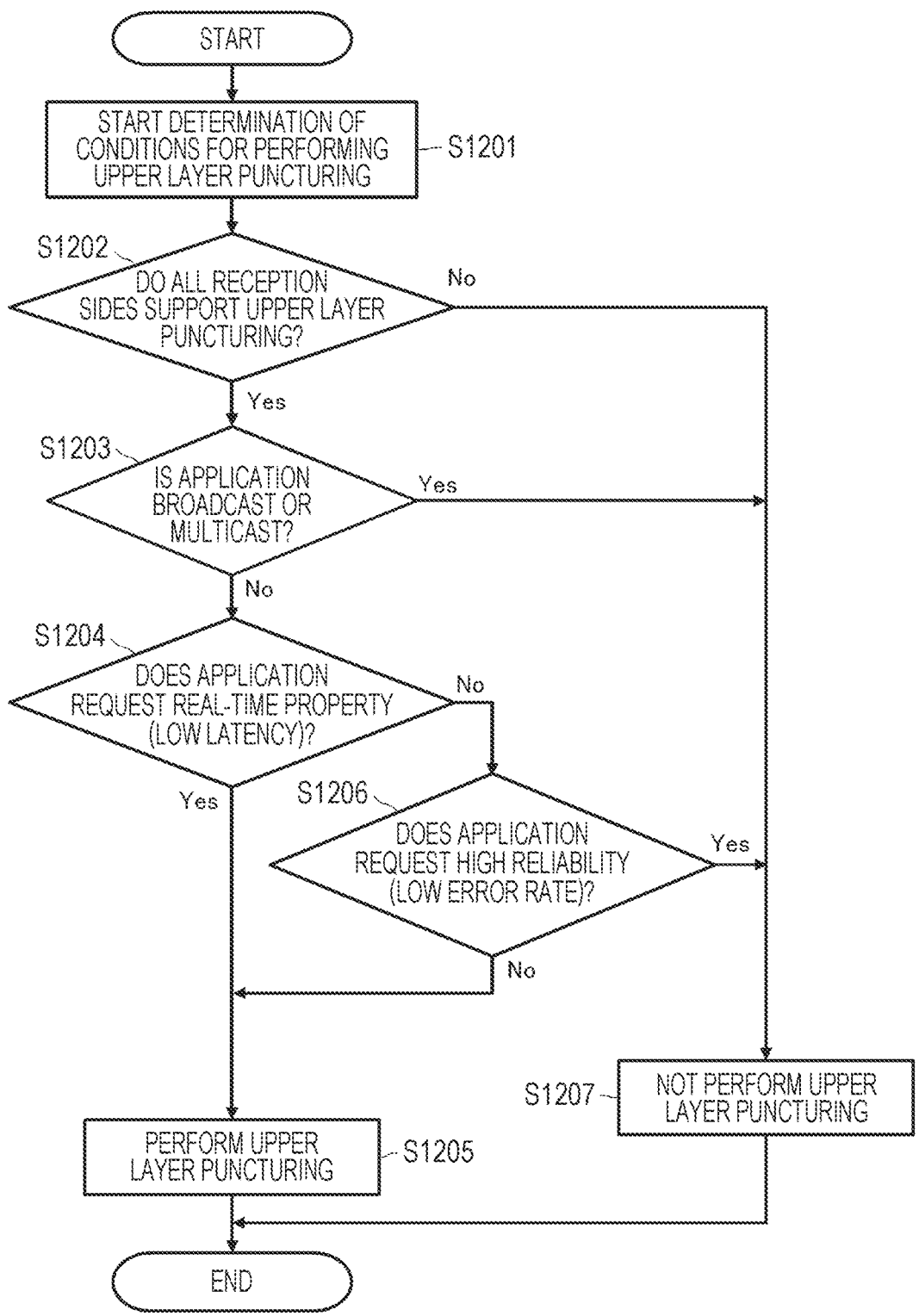
FIG. 12 is a flowchart illustrating a processing procedure for determining whether or not to perform the puncturing in the upper layer.
Figure 13:
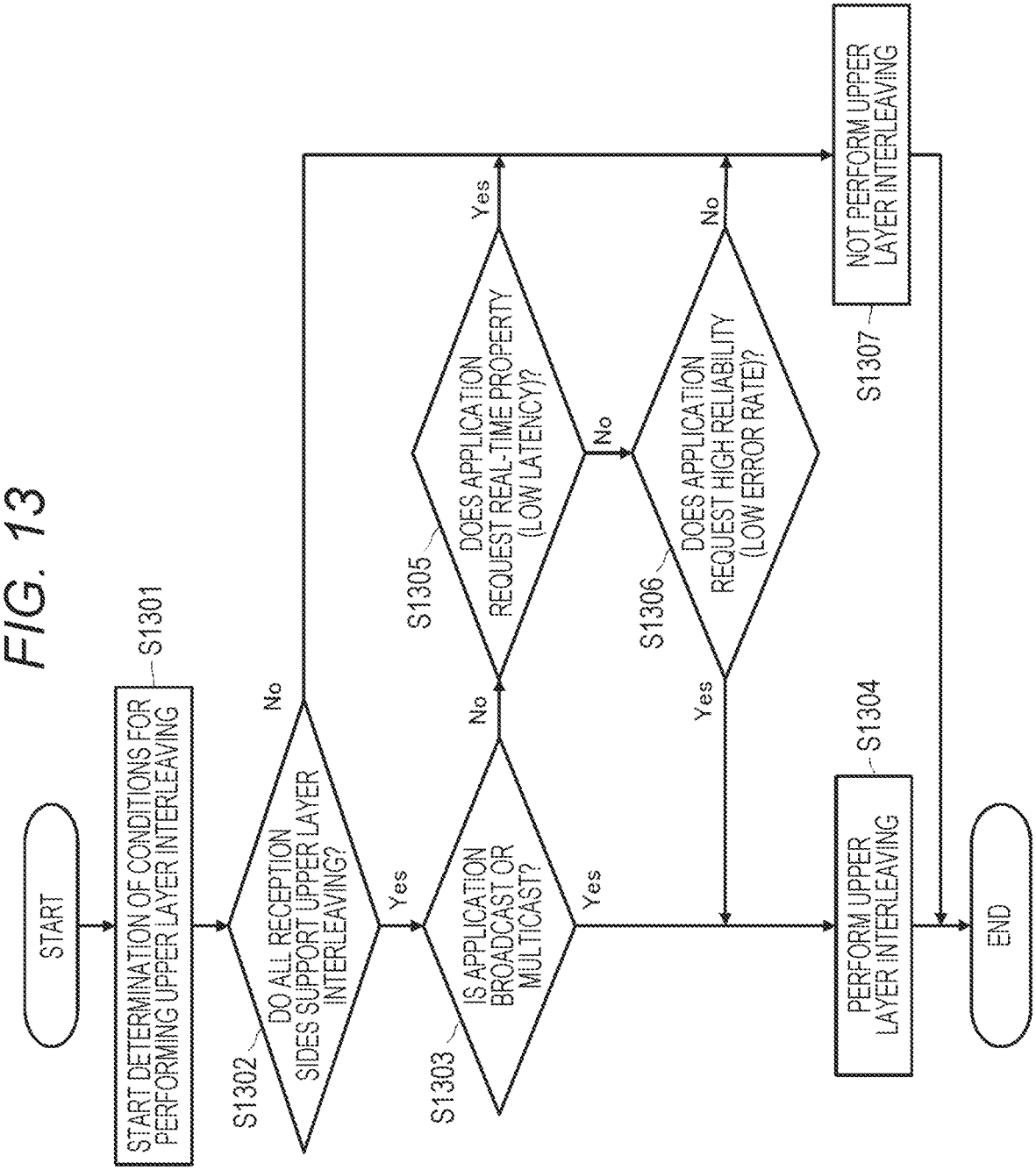
FIG. 13 is a flowchart illustrating a processing procedure for determining whether or not to perform the interleaving in the upper layer.

In the present embodiment, it is also possible to use different conditions for determinations of performing the puncturing and the interleaving, separately from FIG. 11. For example, there is a method of determining whether or not to perform in consideration of the application of the target information sequence and the required communication quality. FIG. 12 illustrates a processing procedure for determining whether or not to perform the puncturing in the upper layer in the form of a flowchart. Furthermore, FIG. 13 illustrates a processing procedure for determining whether or not to perform the interleaving in the upper layer in the form of a flowchart. Both of the processing procedures illustrated in FIGS. 12 and 13 are performed, for example, by the upper layer frame formation processing unit 302 in the transmission side communication device.

First, a processing procedure for determining whether or not to perform the puncturing in the upper layer according to the application of the target information sequence and the required communication quality illustrated in FIG. 12 will be described.

Upon starting the determination of conditions for performing the upper layer puncturing (step S1201), the upper layer frame formation processing unit 302 checks whether or not all the reception side communication devices support the upper layer puncturing (step S1202).

In a case where any one of the reception side communication devices does not support the upper layer puncturing (No in step S1202), the upper layer frame formation processing unit 302 does not perform the upper layer puncturing (step S1207), and ends this processing.

On the other hand, in a case where all the reception side communication devices support the upper layer puncturing (Yes in step S1202), the upper layer frame formation processing unit 302 subsequently checks whether the application of the target information sequence is broadcast or multicast (step S1203).

In a case where the application of the target information sequence is broadcast or multicast (Yes in step S1203), the upper layer frame formation processing unit 302 does not perform the upper layer puncturing (step S1207), and ends this processing. This is because it is desired to suppress occurrence of errors as much as possible in consideration of the fact that retransmission cannot be used in broadcast or multicast. The puncturing has an effect of reducing the amount of data to be transmitted by the lower layer, but from the viewpoint of the error correction capability, the probability of occurrence of errors increases more than that without the puncturing.

In a case where the application of the target information sequence is not broadcast or multicast (No in step S1203), subsequently, the upper layer frame formation processing unit 302 further checks whether or not the application (QCI) of the target information sequence requests the real-time property (or low latency) (step S1204).

In a case where the application (QCI) of the target information sequence requests the real-time property (low latency) (Yes in step S1204), the upper layer frame formation processing unit 302 determines to perform the upper layer puncturing (step S1205), and ends this processing. In a case where the real-time property (low latency) of the application (QCI) of the target information sequence is required, it can be said that it is desirable to perform the puncturing. This is because the amount of data to be transmitted by the lower layer can be reduced by the puncturing.

In a case where the application (QCI) of the target information sequence does not request the real-time property (low latency) (No in step S1204), the upper layer frame formation processing unit 302 further checks whether or not the application (QCI) of the target information sequence requests the high reliability (low error rate) (step S1206).

In a case where the application (QCI) of the target information sequence does not request the high reliability (low error rate) (No in step S1206), the upper layer frame formation processing unit 302 determines to perform the upper layer puncturing (step S1205), and ends this processing.

On the other hand, in a case where the application (QCI) of the target information sequence requests high reliability (low error rate) (Yes in step S1206), the upper layer frame formation processing unit 302 does not perform the upper layer puncturing (step S1207), and ends this processing. In a case where the high reliability (low error rate) of the application (QCI) of the target information sequence is required, it is desirable not to perform the puncturing. This is because puncturing has the effect of reducing the amount of data to be transmitted by the lower layer, but from the viewpoint of the error correction capability, the probability of occurrence of errors increases more than that without the puncturing.

Next, a processing procedure for determining whether or not to perform the interleaving in the upper layer according to the application of the target information sequence and the required communication quality illustrated in FIG. 13 will be described.

Upon starting the determination of conditions for performing the upper layer interleaving (step S1301), the upper layer frame formation processing unit 302 checks whether or not all the reception side communication devices support the upper layer interleaving (step S1302).

In a case where any one of the reception side communication devices does not support the upper layer interleaving (No in step S1302), the upper layer frame formation processing unit 302 does not perform the upper layer interleaving (step S1307), and ends this processing.

On the other hand, in a case where all the reception side communication devices support the upper layer interleaving (Yes in step S1302), the upper layer frame formation processing unit 302 subsequently checks whether the application of the target information sequence is broadcast or multicast (step S1303).

In a case where the application of the target information sequence is broadcast or multicast (Yes in step S1303), the upper layer frame formation processing unit 302, in expectation of an effect of decreasing occurrence of errors and improving reliability, determines to perform the upper layer interleaving (step S1304), and ends this processing.

In a case where the application of the target information sequence is not broadcast or multicast (No in step S1303), subsequently, the upper layer frame formation processing unit 302 further checks whether or not the application (QCI) of the target information sequence requests the real-time property (or low latency) (step S1305).

In a case where the application (QCI) of the target information sequence requests the real-time property (low latency) (Yes in step S1305), the upper layer frame formation processing unit 302 determines not to perform the upper layer interleaving in order not to increase the processing time (step S1307), and ends this processing.

In a case where the application (QCI) of the target information sequence does not request the real-time property (low latency) (No in step S1305), the upper layer frame formation processing unit 302 further checks whether or not the application (QCI) of the target information sequence requests the high reliability (low error rate) (step S1306).

In a case where the application (QCI) of the target information sequence requests the high reliability (low error rate) (Yes in step S1306), the upper layer frame formation processing unit 302, in expectation of the effect of decreasing occurrence of errors and improving reliability, determines to perform the upper layer interleaving (step S1304), and ends this processing.

Furthermore, in a case where the application (QCI) of the target information sequence does not request high reliability (low error rate) (No in step S1306), the upper layer frame formation processing unit 302 determines not to perform the upper layer interleaving (step S1307), and ends this processing.

By performing the interleaving, there is an effect of dispersing errors in a case where an error occurs in a burst manner, and thus it is possible to expect decrease in occurrence of errors and improvement in reliability. On the other hand, by performing the interleaving, rearrangement of blocks, bytes, and bits is required at the time of transmission and reception, and thus there is a concern that additional processing time is required from the viewpoint of delay. In consideration of these, in a case where the application is broadcast or multicast, it is desirable to perform the interleaving in order to improve reliability without retransmission. Furthermore, in a case where an application requires the real-time property, it can be said that it is desirable not to perform the interleaving. In addition, in a case where an application requires the high reliability, it can be said that it is desirable to perform the interleaving. From these conditions, as illustrated in FIGS. 12 and 13, it can be said that it is effective to use different conditions for the puncturing and the interleaving in the upper layer.

C-3. Puncturing and Interleaving in Upper Layer

Figure 14:
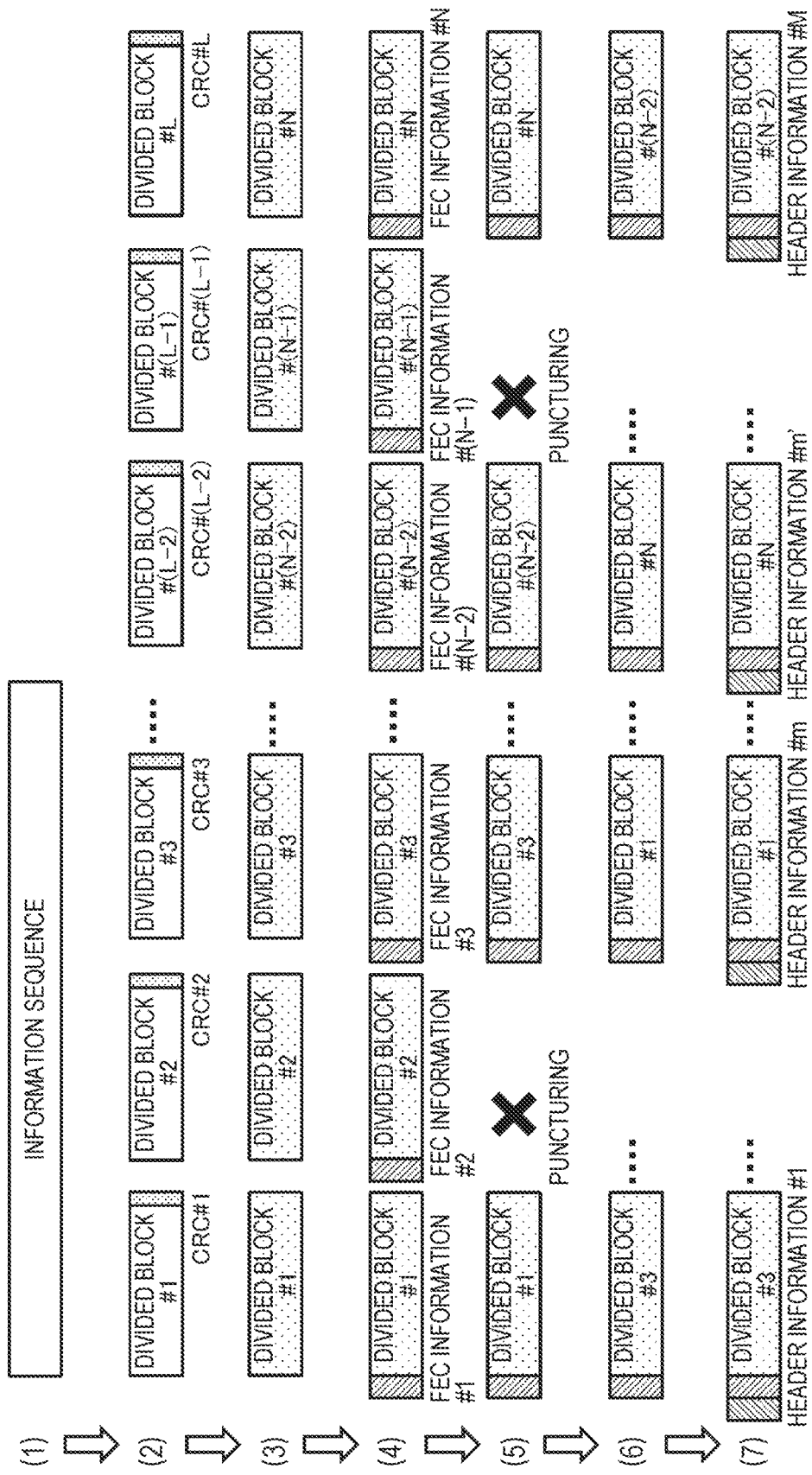
FIG. 14 is a diagram illustrating an example of the puncturing and the interleaving in the upper layer.

FIG. 14 illustrates an example of the puncturing and the interleaving in the upper layer on the transmission side in the communication system according to the present embodiment. In the diagram, an example is illustrated in which an information sequence before the upper layer FEC encoding is divided into a plurality of blocks, each block is subjected to the upper layer FEC encoding, and moreover, the puncturing and the interleaving are performed in units of the blocks. In the diagram, a white information sequence and a white block are before the upper layer FEC encoding, and a block filled with dots is after the upper layer FEC encoding.

Procedures of the puncturing and the interleaving in the upper layer will be described below along (1) to (7) in the diagram.

(1) First, the information sequence is received from a further upper layer. In a case where the target upper layer is L2, packets (Internet Protocol (IP) packets) from L3 can be assumed as this information sequence. Furthermore, in a case of application to the L2 layer (data link layer), assuming that target upper layers are packet data convergence protocol (PDCP), radio link control (RLC), and media access control (MAC), the information sequences in FIG. 14 are a PDCP service data unit (SDU), an RLC SDU (or a PDCP protocol data unit (PDU)), and a MAC SDU (or an RLC PDU), respectively. The information sequence desirably further includes a header and a payload of an upper layer.

(2) Then, the information sequence is divided into a plurality of blocks. In the present embodiment, the M encoded information sequences are divided into L pieces. FIG. 14 illustrates a case where M=1. In the present embodiment, the sizes of blocks after dividing are either equal sizes or unequal sizes. In a case of division into equal sizes, addition of padding or the like is further conceivable (described later). A CRC bit sequence may be further added to each of the divided blocks. The CRC bit depth is desirably the same among the divided blocks. Note that instead of the CRC bit sequence, another error detection code sequence having an error detection capability may be added.

(3) The upper layer FEC encoding is performed on the blocks (including CRC in a case where the CRC is added) of the divided information sequence. L blocks as a result of performing the upper layer FEC encoding are N blocks. Here, the relationship is N=L+P, and P is the number of redundant blocks added by the upper layer FEC. The redundant blocks may be referred to as parity blocks. In the present embodiment, it is desirable that a relationship of P<L≤N is established. The L blocks after the FEC encoding are desirably the same as L blocks of the original information sequence. The P redundant blocks include at least a part of the original information sequence and a parity sequence generated by encoding. Alternatively, the redundant blocks include only the parity sequence generated by encoding. The coding rate r at the time of upper layer FEC encoding is as presented by Expression 1 described below. This coding rate may be determined in advance according to the FEC code to be employed.

[Math. 1]

$$r = \frac{L}{N} = \frac{L}{L+P} \quad \text{(Expression 1)}$$

In the present embodiment, the value of P is linearly proportional to the number of blocks L of the original information sequence (that is, being the relationship of P=αL (0<α≤1) is desirable). Furthermore, as another example, FEC encoding in which the coding rate r has a predetermined value (P=$P_{fix}$) regardless of L, or a case where the magnitudes of L and P are not linearly proportional to each other (for example, P=β$L^2$+δ, where β>0, δ>0, and the like) may be used.

Figure 27:
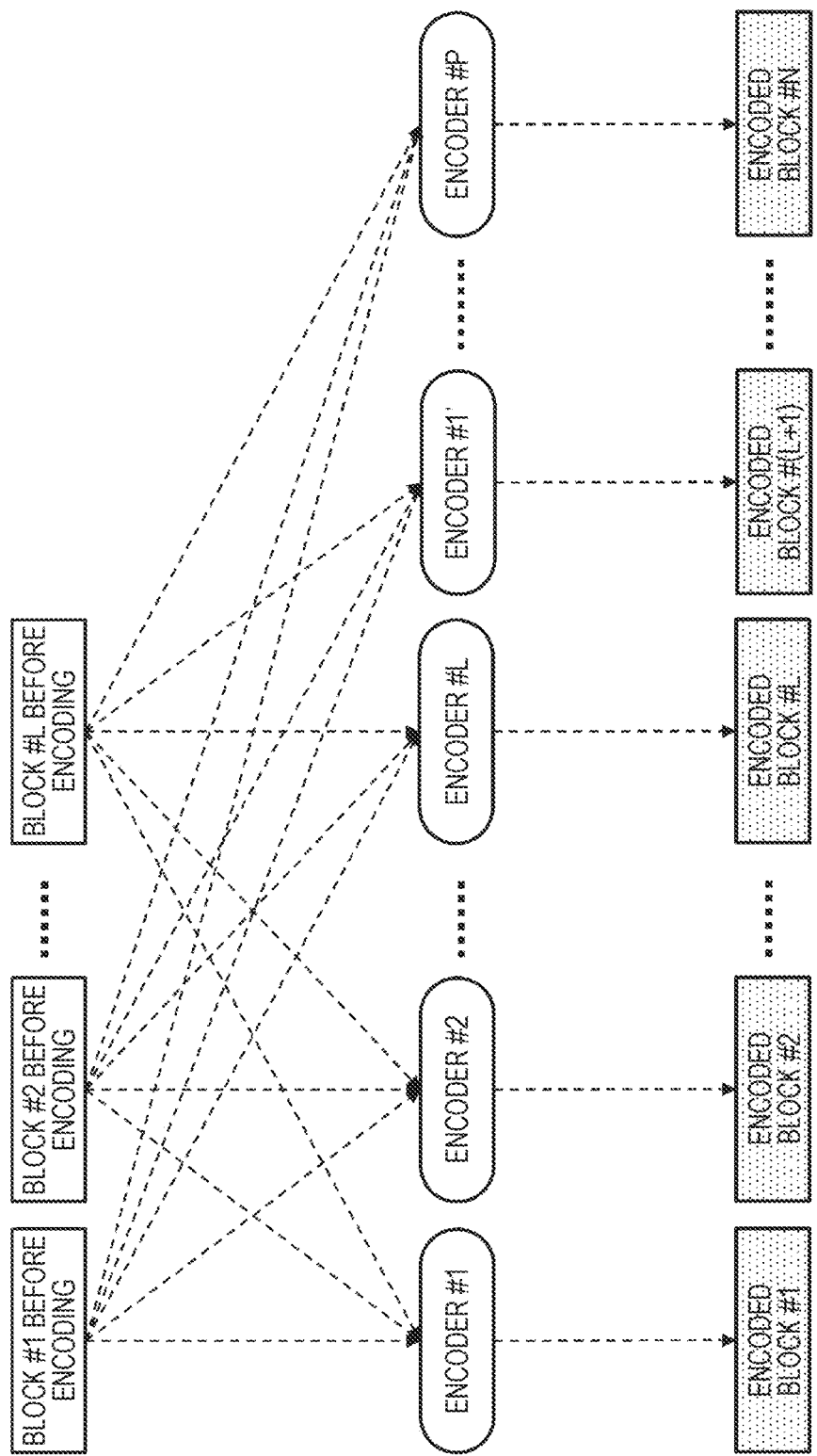
FIG. 27 is a diagram illustrating an example of the upper layer FEC encoding.

FIG. 27 illustrates an example in which the upper layer FEC encoding is performed on L blocks before encoding to generate N (=L+P) blocks after encoding (however, notation of the CRC is omitted). In the upper layer FEC encoding according to the present embodiment, a plurality of blocks before encoding is input to one encoder. For a block after encoding generated from a plurality of blocks before encoding, a parity sequence is included in the block.

Figure 28:
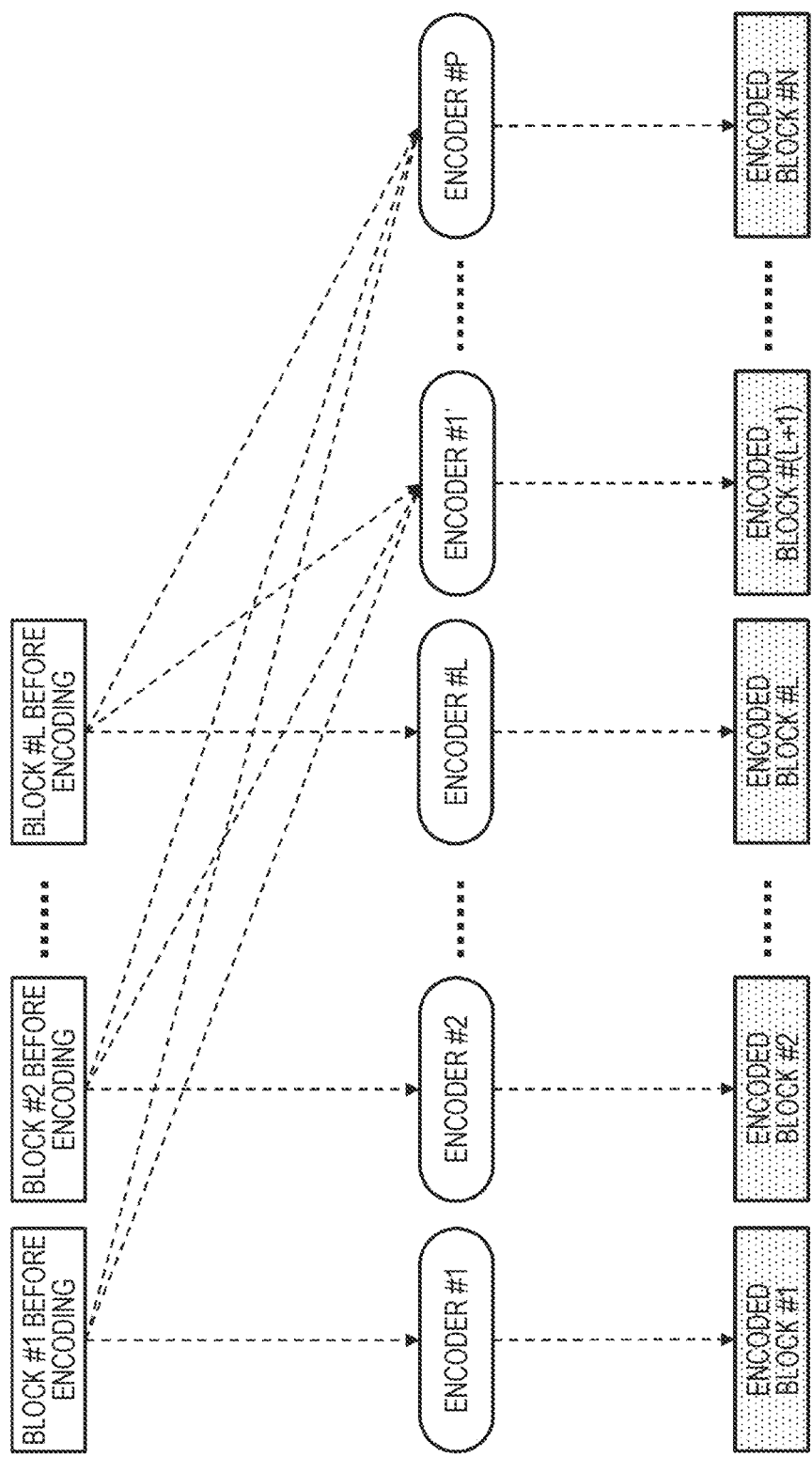
FIG. 28 is a diagram illustrating another example of the upper layer FEC encoding.

FIG. 28 illustrates another example in which the upper layer FEC encoding is performed on the L blocks before encoding to generate N (=L+P) blocks after encoding. In the example illustrated in FIG. 28, the number of encoded blocks input to each encoder is different. As an example, one of blocks before encoding is input to an encoder that generates blocks 1 to L after encoding. These encoders can also output blocks before encoding without any change. In a case of outputting without any change, the encoder may be omitted together.

A plurality of blocks before encoding is input to an encoder that generates P blocks from the encoded block (L+1) to the block N after encoding. The blocks after encoding generated by inputting a plurality of blocks before encoding correspond to the above-described redundant blocks (or parity blocks).

Next, details of the encoder will be described. The i-th bit $b_i$ of the l-th block before encoding is as presented by Expression 2 described below. Furthermore, the n-th encoded block (output of the n-th encoder) $d_n$ is as presented by Expression 3 described below. Then, the encoded block is generated similarly to Expression 4 described below.

[Math. 2]

$$b_l(i) \in \{0,1\}, (i=1, \ldots, D) \quad \text{(Expression 2)}$$

[Math. 3]

$$d_n(i) \in \{0,1\}, (i=1, \ldots, D) \quad \text{(Expression 3)}$$

[Math. 4]

$$d_n(i) = c_{n,1}(i)b_1(i) \oplus c_{n,2}(i)b_2(i) \oplus \ldots \oplus c_{n,L}(i)b_L(i) \quad \text{(Expression 4)}$$

Note that $c_{n,l}(i)$, (i=1, ..., D, n=1, ..., L) in above Expression 4 are weighting factors for the l-th block before encoding (the l-th input to the n-th encoder #n) in the n-th encoder #n. For example, a value that can be taken by $c_{n,l}(i)$ is as presented by Expression 5 described below.

[Math. 5]

$$c_{n,l}(i) \in \{0,1\} \quad \text{(Expression 5)}$$

Furthermore, an operator (circled character of symbol "+") in Expression 4 above means an operation in the encoder. This operation is desirably any of XOR (addition of Mod 2), OR, and AND, for example. Examples of operations of XOR, OR, and AND are illustrated in Table 4, Table 5, and Table 6, respectively.

TABLE 4

Example of XOR operation

| a | b | a⊕b |
|---|---|-----|
| 0 | 0 | 0 |
| 0 | 1 | 1 |
| 1 | 0 | 1 |
| 1 | 1 | 0 |

TABLE 5

Example of OR operation

| a | b | a⊕b |
|---|---|-----|
| 0 | 0 | 0 |
| 0 | 1 | 1 |
| 1 | 0 | 1 |
| 1 | 1 | 1 |

TABLE 6

Example of AND operation

| a | b | a⊕b |
|---|---|-----|
| 0 | 0 | 0 |
| 0 | 1 | 0 |
| 1 | 0 | 0 |
| 1 | 1 | 1 |

In summary, the encoder represented by above Expression 4 receives a plurality of blocks as inputs, weights every bit of each block by a weighting factor, combines the blocks by arithmetic processing (logical arithmetic processing), and outputs the combined blocks.

In a case where the blocks are the same as the blocks before encoding like the blocks 1 to L after encoding illustrated in FIG. 28, the blocks after encoding are generated as presented by Expression 6 below. In this case, the encoders from the encoder #1 to the encoder #L may be handled as to be omitted.

[Math. 6]

$$d_n(i) = b_n(i) \quad \text{(Expression 6)}$$

Alternatively, in a case where bits are weighted in a block before encoding, the block after encoding is generated as presented by Expression 7 below.

[Math. 7]

$$d_n(i) = c_n(i)b_n(i) \quad \text{(Expression 7)}$$

(4) Next, FEC information is added to each encoded divided block. The FEC information includes information for assisting efficient decoding when the divided blocks are concatenated and FEC decoded on the reception side. Specifically, the number of the arrangement order of the divided blocks (sequence number (ID) corresponding to #1, #2, ..., #N, and the like in FIG. 14), the total number of the divided blocks (corresponding to the value of N), the number (ID) of the encoded information sequence serving as the division source, the size of the block (data amount), and the like can be mentioned. There is a possibility that the divided blocks reach the reception side in a state where the order is transposed or in a state where the order is lost due to puncturing, interleaving, an error in the lower layer, and the like as described later, and thus the reception side communication device can grasp which block is transposed and which block is lost by referring to these pieces of FEC information.

(5) Next, the puncturing is performed on the coded divided block so that a part is not transmitted. In the present embodiment, in a case where a block is divided into a plurality of blocks, the puncturing is performed in units of the blocks. It is to be sufficiently understood that the puncturing is performed in units of blocks after the error correction encoding in the divided upper layer. In the example illustrated in FIG. 14, the divided block #2 and the divided block #(N−1) are excluded from the transmission target due to the puncturing (furthermore, it may be assumed that there is punctured one among blocks omitted in the diagram). As a general system, K blocks among N blocks are transmitted (in other words, (N−K) blocks are deleted from the transmission target by the puncturing). Here, the value of K is desirably a positive integer satisfying Expression 8 described below.

[Math. 8]

$$K \geq \text{floor}\left(\frac{N}{2}\right) \text{ or } K \geq \text{ceil}\left(\frac{N}{2}\right) \quad \text{(Expression 8)}$$

In the present embodiment, specifically, it is desirable to select and puncture a block by any one of a first method, a second method, or a third method described below.

In the first method, the j-th, $$j\text{-}th + \text{floor}\left(\frac{N}{N-K}\right)\text{-}th, \ j\text{-}th + 2\text{floor}\left(\frac{N}{N-K}\right)\text{-}th,$$

and $$j\text{-}th + (N-K-1) \text{ floor}\left(\frac{N}{N-K}\right)\text{-}th$$

blocks are selected and punctured (or $$j\text{-}th + k \cdot \text{floor}\left(\frac{N}{N-K}\right)\text{-}th$$

block is selected and punctured. Here, k is an integer in the range of 0≤k≤N−K−1). Here, j is an integer in the range of 1≤j≤N−K−1)

$$\text{floor}\left(\frac{N}{K}\right).$$

The value of j may be in a shared state between the transmission side and the reception side with each other. Furthermore, instead of the floor( ) (rounding off), ceil( ) (rounding up), or round ( ) (rounding) may be used.

In the second method, blocks sequentially aligned from the j-th block to the (j+N−K−1)-th blocks are selected and punctured. Here, j is an integer in the range of 1≤j≤K+1. The value of j may be in a shared state between the transmission side and the reception side with each other.

In the third method, K blocks are randomly selected on the transmission side and punctured.

(6) Interleave processing (processing of transposing the order of the divided blocks) may be performed on the divided blocks subjected to puncturing processing. Even in a case where an error occurs in a plurality of continuous divided blocks by the interleave processing, the places of the divided blocks in which the error has occurred can be distributed by performing the deinterleave processing on the reception side (possibility is increased that the divided blocks in which the error has occurred can be avoided from being continuous). In the present embodiment, it is to be sufficiently understood that the interleaving is performed in units of blocks after the error correction encoding in the divided upper layer.

(7) Header information is added to the head of a block including FEC information for each divided block subjected to the puncturing processing and the interleave processing. The header information includes information necessary as a protocol of the upper layer.

For example, in a case where the upper layer to be applied is the session layer (L4 layer), a source port number (Source Port), a destination port number (Destination Port), a sequence number (Sequence Number), an acknowledgement number, a data offset (Data offset), a reservation (Reserve), a control flag (Control Flag), a window size (Window Size), a checksum (Checksum), an emergency pointer, an option, padding (Padding), and the like are added to the head of each divided block as header information.

Furthermore, in a case where the upper layer to be applied is the IP layer (L3 layer), an IP version (IP Version), a header length (Internet Header Length), a service type (Type of Service or Priority), a traffic type (Traffic Class), a flow type (Flow Label), a total length (Total Length, including header and payload), a payload length (Payload Length), a next header (Next Header), a hop limit (Hop Limit), an identifier (Identifier), flags (Version Control Flags), a fragment position (Fragment Offset), a time to live (Time to Live), a protocol (Protocol), a checksum (Header Checksum), a source IP address (Source IP Address), a destination IP address (Destination IP Address), extension information (Options), and the like are added to the head of each divided block as header information.

Furthermore, in a case where the upper layer to be applied is the data link layer (L2 layer), a source MAC address, a destination MAC address, a length, a source service access point (SAP), a destination service access point (destination SAP), and the like are added to the head of each divided block as header information.

The stage illustrated in (7) in FIG. 14 is output from the upper layer to the lower layer in the transmission side communication device according to the present embodiment. In a case of application to the L2 layer (data link layer), assuming that target upper layers are PDCP, RLC, and MAC, outputs of (7) in FIG. 14 are a PDCP PDU (or an RLC SDU), an RLC PDU (or a MAC SDU), and a MAC PDU (or a PHY SDU and a Transport Block), respectively.

Figure 15:
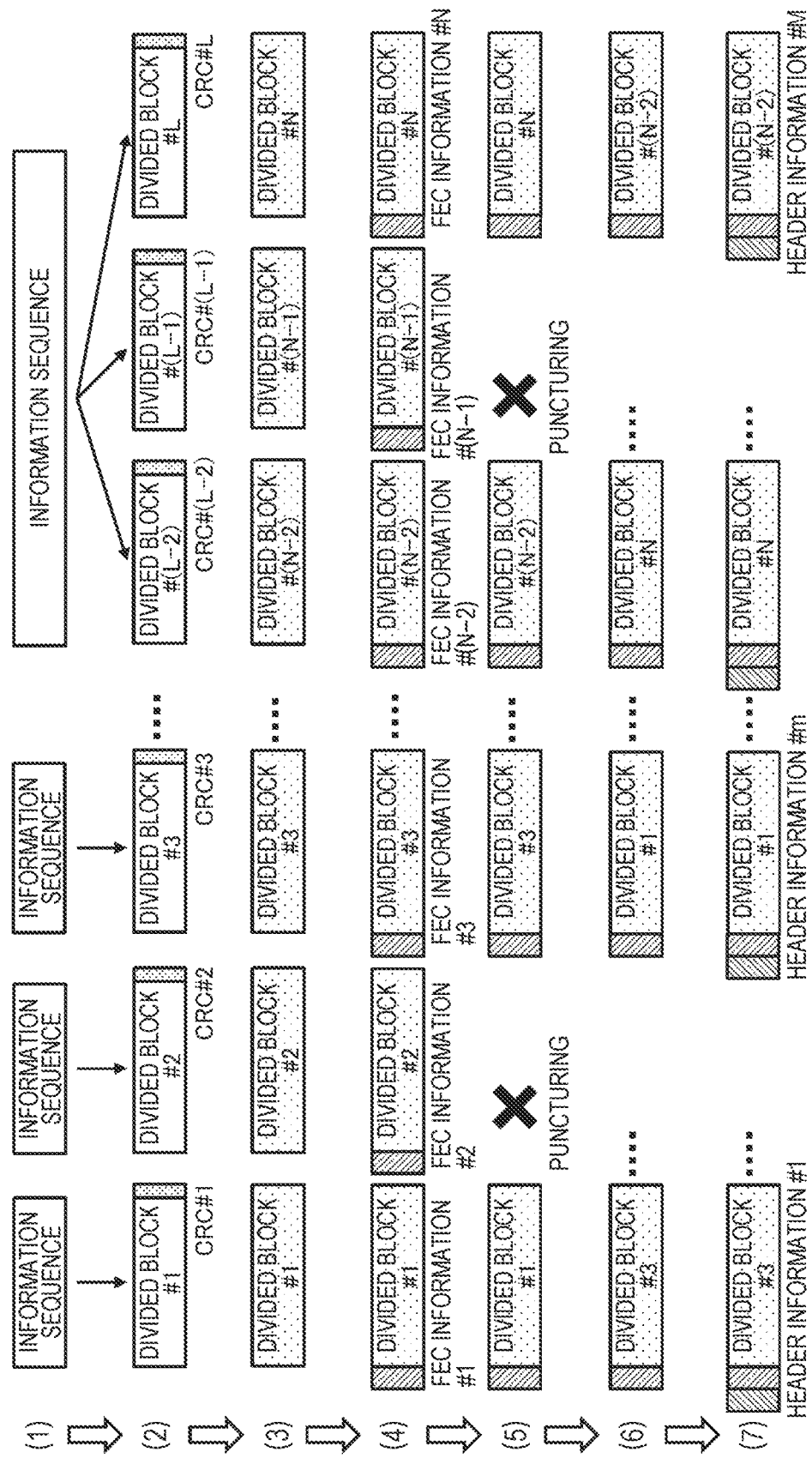
FIG. 15 is a diagram illustrating an example of the puncturing and the interleaving in the upper layer (in a case of including an information sequence that is not divided).

For (1) and (2) in FIG. 14, there may be cases where the information sequence is not divided depending on the size of the information sequence from the upper layer. FIG. 15 illustrates an example of the puncturing and the interleaving in the upper layer including a case where the information sequence is not divided. To a condition that division does not occur, for example, a case where the size of the information sequence is D bits or less when the size of the divided block is D bits corresponds. In such a case, without substantially performing division, the information sequence of (1) becomes divided blocks without any change in (2). Moreover, in a case where the information sequence is less than D bits, bit padding is performed so as to be D bits.

C-4. Puncturing and Interleaving in Upper Layer (Other Examples)

Figure 16:
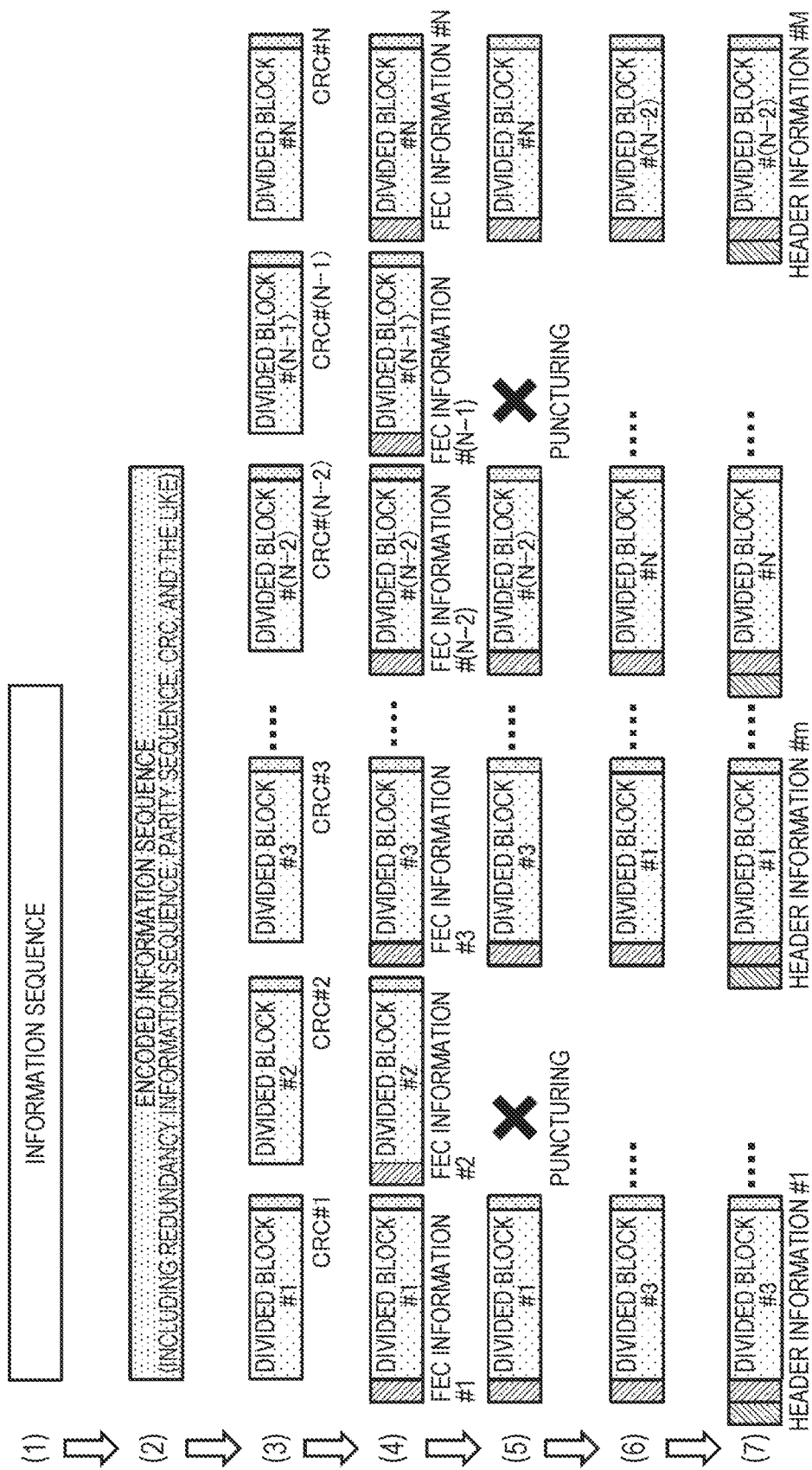
FIG. 16 is a diagram illustrating another example of the puncturing and the interleaving in the upper layer (example of performing the puncturing and the interleaving in units of blocks divided from the information sequence after the upper layer FEC encoding).

FIG. 16 illustrates another example of the puncturing and the interleaving in the upper layer on the transmission side in the communication system according to the present embodiment. In the diagram, an example is illustrated in which the information sequence after the upper layer FEC encoding is divided into a plurality of blocks, and the puncturing and the interleaving are performed in units of the blocks. Procedures of the puncturing and the interleaving in the upper layer will be described below along (1) to (7) in the diagram.

(1) First, the information sequence is received from a further upper layer. In a case where the target upper layer is L2, packets (IP packets) from L3 can be assumed as this information sequence. Furthermore, in a case of application to the L2 layer (data link layer), when target upper layers are PDCP, RLC, and MAC, the information sequences in FIG. 16 are the PDCP SDU, the RLC SDU (or the PDCP PDU), and the MAC SDU (or RLC PDU), respectively. The information sequence desirably further includes a header and a payload of an upper layer.

(2) Next, upper layer FEC encoding is performed on the information sequence received from the upper layer. The information sequence after upper layer FE encoding includes an original information sequence and a parity sequence added by encoding. Assuming that the data size of the original information sequence is D and the size of the sequence (for example, a parity sequence) added by the upper layer FEC encoding is P, the coding rate r at the time of the upper layer FEC encoding is as presented by Expression 9 described below. This coding rate may be determined in advance according to the FEC code to be employed.

[Math. 9]

$$r = \frac{D}{D+P} \quad \text{(Expression 9)}$$

In this case, the size P of the parity sequence is linearly proportional to the data size D of the original information sequence (that is, the relationship of P=αL (0<α≤1) is desirably satisfied). Furthermore, as another example, the encoding may be such that the coding rate r is not constant with respect to D. For example, the FEC encoding may be such that the size P of the parity sequence added by the FEC encoding is a predetermined value (P=$P_{fix}$) regardless of the value of D, or may be a case where the magnitudes of L and P are not linearly proportional to each other (for example, P=$\beta D^2+\delta$, where β>0, δ>0, and the like). Moreover, the CRC bit sequence for the entire encoded information sequence may be added.

(3) Next, the information sequence after encoding is divided into a plurality of blocks. In the present embodiment, M encoded information sequences are divided into N pieces. FIG. 16 illustrates a case where M=1. In the present embodiment, the sizes of blocks after dividing are either equal sizes or unequal sizes. In a case of division into equal sizes, addition of padding or the like is further conceivable (described later). The CRC bit sequence may be further added to each of the divided blocks. The CRC bit depth is desirably the same among the divided blocks.

(4) Next, FEC information is added to each divided block. The FEC information includes information for assisting efficient decoding when the divided blocks are concatenated and FEC decoded on the reception side. Specifically, the number of the arrangement order of the divided blocks (sequence number (ID) corresponding to #1, #2, . . . , #N, and the like in FIG. 16), the total number of the divided blocks (corresponding to the value of N), the number (ID) of the encoded information sequence serving as the division source, the size of the block (data amount), and the like can be mentioned. There is a possibility that the divided blocks reach the reception side in a state where the order is transposed or in a state where the order is lost due to puncturing, interleaving, an error in the lower layer, and the like as described later, and thus the reception side communication device can grasp which block is transposed and which block is lost by referring to these pieces of FEC information.

(5) Next, the puncturing is performed on the coded divided block so that a part is not transmitted. In the present embodiment, in a case where a block is divided into a plurality of blocks, the puncturing is performed in units of the blocks. It is to be sufficiently understood that the puncturing is performed in units of blocks after the error correction encoding in the divided upper layer. In the example illustrated in FIG. 14, the divided block #2 and the divided block #(N−1) are excluded from the transmission target due to the puncturing (furthermore, it may be assumed that there is punctured one among blocks omitted in the diagram). As a general system, K blocks among N blocks are transmitted (in other words, (N−K) blocks are deleted from the transmission target by the puncturing). Here, the value of K is desirably a positive integer satisfying Expression 10 described below.

[Math. 10]

$$K \geq \text{floor}\left(\frac{N}{2}\right) \text{ or } K \geq \text{ceil}\left(\frac{N}{2}\right) \quad \text{(Expression 10)}$$

In the present embodiment, specifically, it is desirable to select and puncture a block by any method of a fourth method, a fifth method, or a sixth method described below.

In the fourth method, the j-th, $$j\text{-}th + \text{floor}\left(\frac{N}{N-K}\right)\text{-}th, \; j\text{-}th + 2floor\left(\frac{N}{N-K}\right)\text{-}th,$$

and $$j\text{-}th + (N-K-1)\text{ floor}\left(\frac{N}{N-K}\right)\text{-}th$$

blocks are selected and punctured (or $$j\text{-}th + k \cdot \text{floor}\left(\frac{N}{N-K}\right)\text{-}th$$

block is selected and punctured. Here, k is an integer in the range of 0≤k≤N−K−1). Here, j is an integer in the range of 1≤j≤N−K−1)

$$\text{floor}\left(\frac{N}{K}\right).$$

The value of j may be in a shared state between the transmission side and the reception side with each other. Furthermore, instead of the floor( ) (rounding off), ceil( ) (rounding up), or round ( ) (rounding) may be used.

In the fifth method, blocks sequentially aligned from the j-th block to the (j+N−K−1)-th blocks are selected and punctured. Here, j is an integer in the range of 1≤j≤K+1. The value of j may be in a shared state between the transmission side and the reception side with each other.

In the sixth method, K blocks are randomly selected on the transmission side and punctured.

(6) Interleave processing (processing of transposing the order of the divided blocks) may be performed on the divided blocks subjected to puncturing processing. Even in a case where an error occurs in a plurality of continuous divided blocks by the interleave processing, the places of the divided blocks in which the error has occurred can be distributed by performing the deinterleave processing on the reception side (possibility is increased that the divided blocks in which the error has occurred can be avoided from being continuous). In the present embodiment, it is to be sufficiently understood that the interleaving is performed in units of blocks after the error correction encoding in the divided upper layer.

(7) Header information is added to the head of a block including FEC information for each divided block subjected to the puncturing processing and the interleave processing. The header information includes information necessary as a protocol of the upper layer.

For example, in a case where the upper layer to be applied is the session layer (L4 layer), a source port number (Source Port), a destination port number (Destination Port), a sequence number (Sequence Number), an acknowledgement number, a data offset (Data offset), a reservation (Reserve), a control flag (Control Flag), a window size (Window Size), a checksum (Checksum), an emergency pointer, an option, padding (Padding), and the like are added to the head of each divided block as header information.

Furthermore, in a case where the upper layer to be applied is the IP layer (L3 layer), an IP version (IP Version), a header length (Internet Header Length), a service type (Type of Service or Priority), a traffic type (Traffic Class), a flow type (Flow Label), a total length (Total Length, including header and payload), a payload length (Payload Length), a next header (Next Header), a hop limit (Hop Limit), an identifier (Identifier), flags (Version Control Flags), a fragment position (Fragment Offset), a time to live (Time to Live), a protocol (Protocol), a checksum (Header Checksum), a source IP address (Source IP Address), a destination IP address (Destination IP Address), extension information (Options), and the like are added to the head of each divided block as header information.

Furthermore, in a case where the upper layer to be applied is the data link layer (L2 layer), a source MAC address, a destination MAC address, a length, a source service access point (SAP), a destination service access point (destination SAP), and the like are added to the head of each divided block as header information.

The stage illustrated in (7) in FIG. 16 is output from the upper layer to the lower layer in the transmission side communication device according to the present embodiment. In the case of application to the L2 layer (data link layer), assuming that target upper layers are PDCP, RLC, and MAC, outputs of (7) in FIG. 16 are the PDCP PDU (or the RLC SDU), the RLC PDU (or the MAC SDU), and the MAC PDU (or the PHY SDU and the Transport Block), respectively.

C-5. Divided Block, Size, and Padding of Information Sequence

In the present embodiment, it is possible to equally divide the sizes of the divided blocks or unequally divide the sizes of the divided blocks without having to have the same size.

In a case of equal division, there are cases where equal division cannot be performed as they are depending on the size of the original information sequence. Specifically, a divided block having a fractional size may occur. In such a case, padding is applied to at least one of the information sequence before the upper layer FEC encoding, the encoded information sequence after the upper layer FEC encoding, or the divided block after dividing, so as to adjust the sizes of the divided blocks to be equal.

Figure 17:
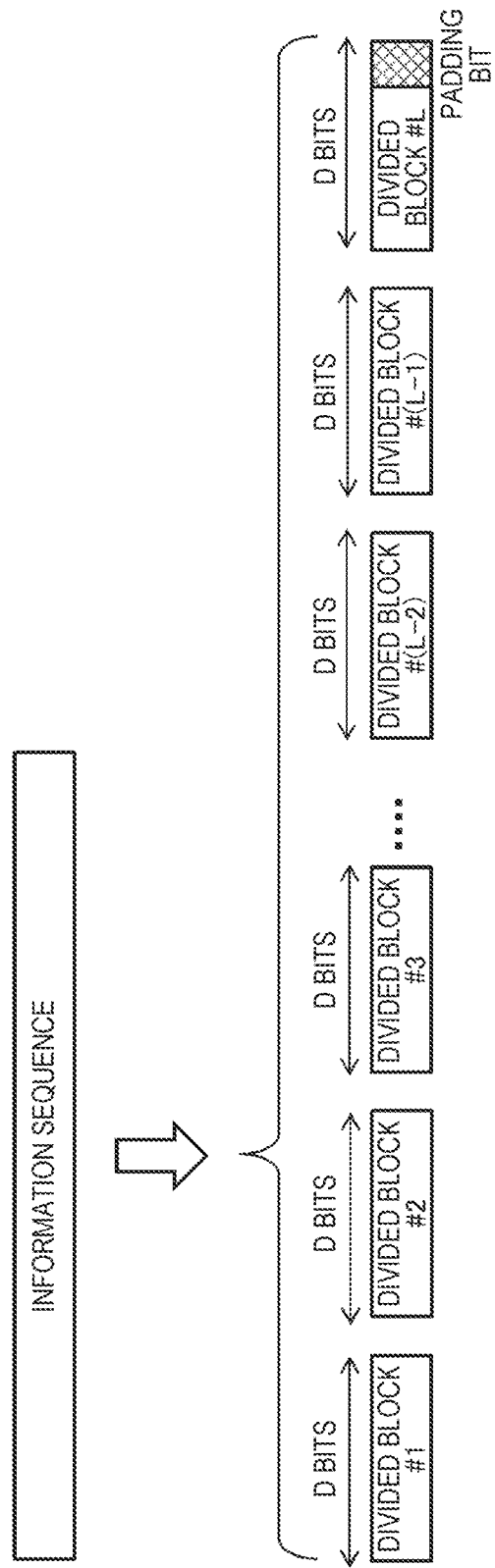
FIG. 17 is a diagram illustrating an example in which the information sequence is divided and padding bits are added.

FIG. 17 illustrates a state in which an information sequence is divided into a plurality of blocks and padding bits are added to the divided blocks. For example, it is assumed that the bit depth of a divided block (not including the CRC) in a case where the information sequence is equally divided into L blocks is D. When the bit depth $D_U$ of the original information sequence is equal to DL, a divided block having a fractional size does not occur. However, in a case where $D_U \neq DL$, the $D_U - D(L-1)$ bits become a fraction. In a case where the fraction occurs, one of the L divided blocks (desirably L-th) is padded with $D - D_U + D(L-1)$ bits, and processing is performed so that all the L divided blocks have the same bit depth (D bits). In a case where the data sizes of the blocks are already equal at a point of time before the padding bits are added, it is not necessary to add the padding bits.

The bit sequences used for the padding may be all 0 (zero) or all 1. Furthermore, the padding may be performed using a predetermined bit sequence pattern. Furthermore, the padding may be performed using a sequence of random 0 and 1.

Figure 18:
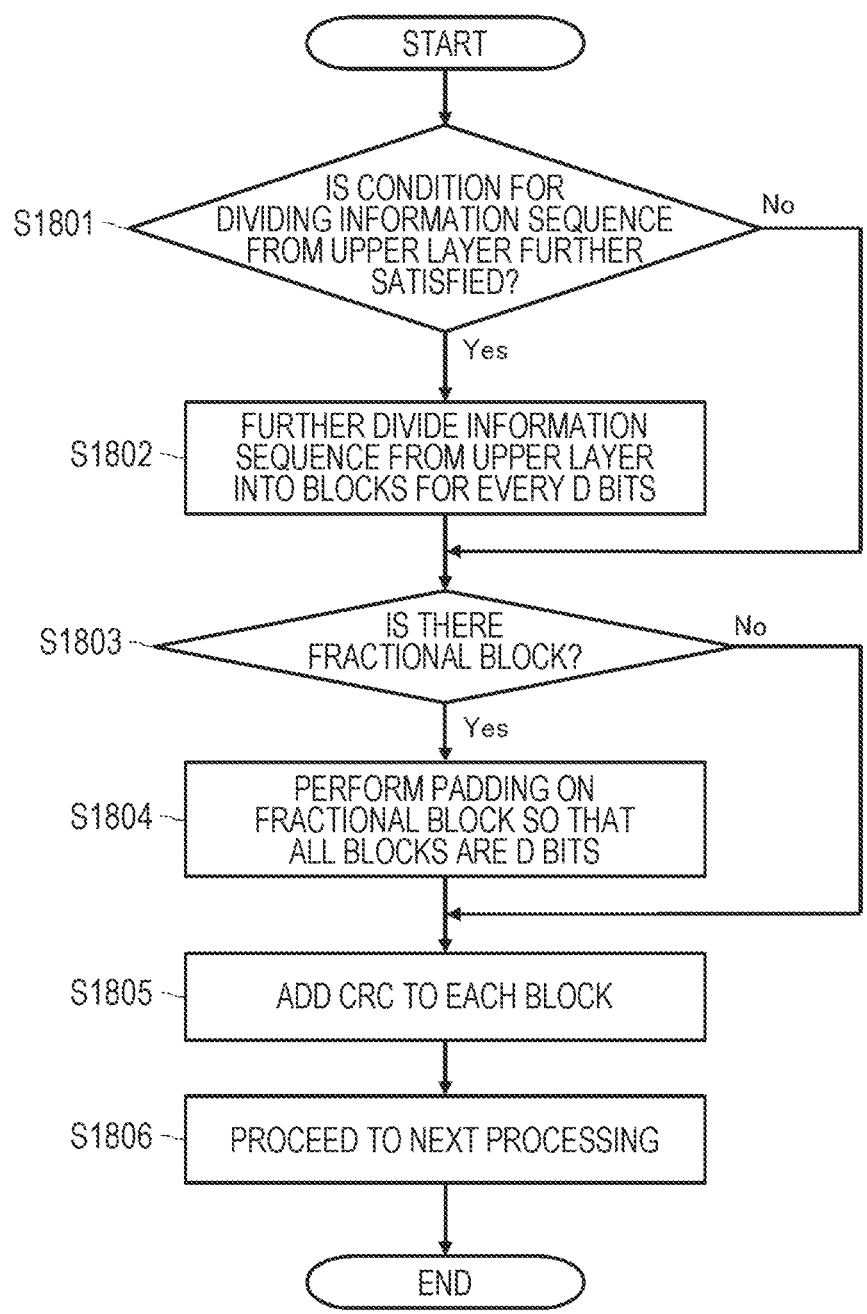
FIG. 18 is a flowchart illustrating a processing procedure for dividing the information sequence into a plurality of blocks and adding padding bits to the divided blocks.

FIG. 18 illustrates a processing procedure for dividing the information sequence into a plurality of blocks and adding the padding bits to the divided blocks in the form of a flowchart. The illustrated processing procedure is performed, for example, by the upper layer frame formation processing unit 302 in the transmission side communication device.

First, the upper layer frame formation processing unit 302 further checks whether or not a condition for dividing the information sequence from the upper layer is satisfied (step S1801). For example, in a case where the bit depth $D_U$ of the information sequence is equal to or less than the bit depth D of the divided block, it is not necessary to divide the information sequence, and it is determined that the condition for division is not satisfied (No in step S1801), so that the division is not performed.

In a case where the condition for dividing the information sequence from the upper layer is satisfied (Yes in step S1801), the upper layer frame formation processing unit 302 divides the information sequence from the upper layer into blocks of every D bits (step S1802).

Then, the upper layer frame formation processing unit 302 checks whether there is a fractional block less than the predetermined bit depth D (step S1803).

Here, in a case where there is a fractional block less than the predetermined bit depth D (Yes in step S1803), the padding is performed on the fractional block using the bit sequence (described above) used for padding so that all the blocks are equal to the D bits (step S1804). Furthermore, in a case where there is no fractional block (No in step S1803), the padding is not performed.

Next, the upper layer frame formation processing unit 302 adds the CRC to each block (step S1805), and proceeds to the next processing (step S1806). For example, in a case where the information sequence is divided and then the upper layer FEC encoding is performed as illustrated in FIG. 14, the next processing corresponds to the upper layer FEC encoding processing.

C-6. Processing of Upper Layer Reception Side

Figure 19:
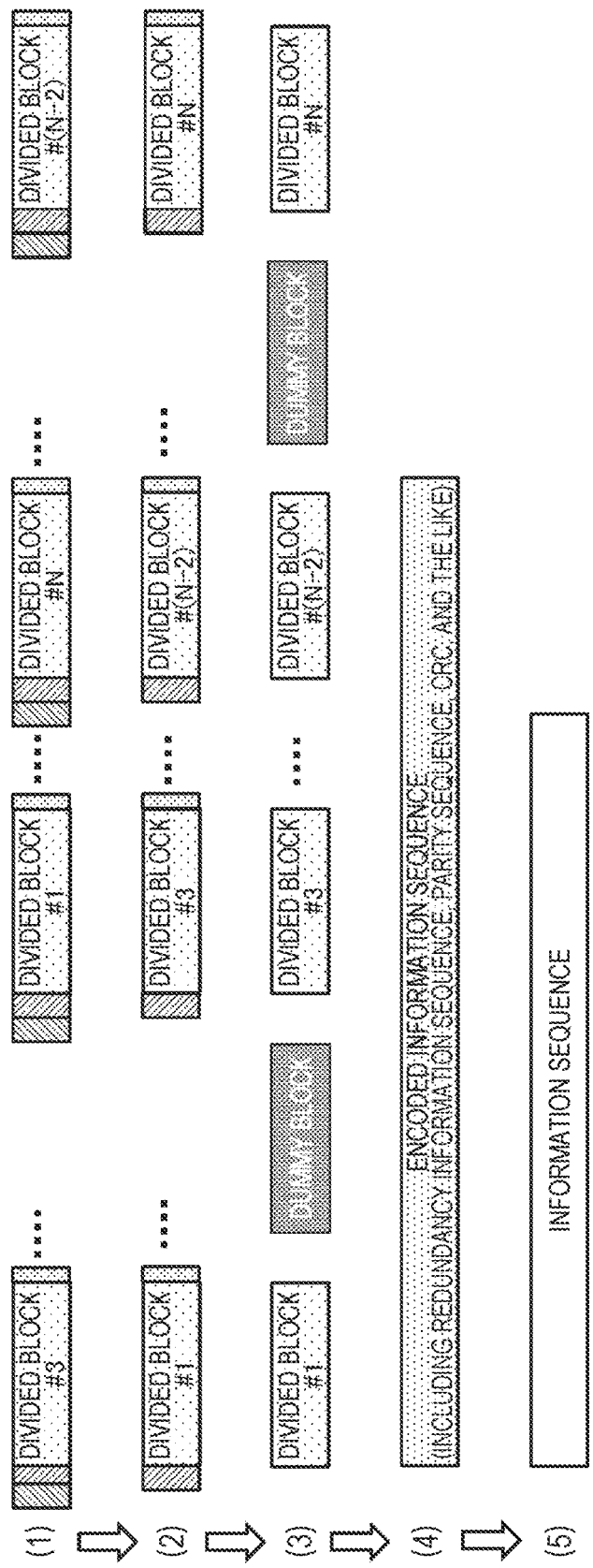
FIG. 19 is a diagram illustrating an example of depuncturing and deinterleaving in the upper layer on the reception side (an example of inserting a dummy block into a punctured block).
Figure 20:
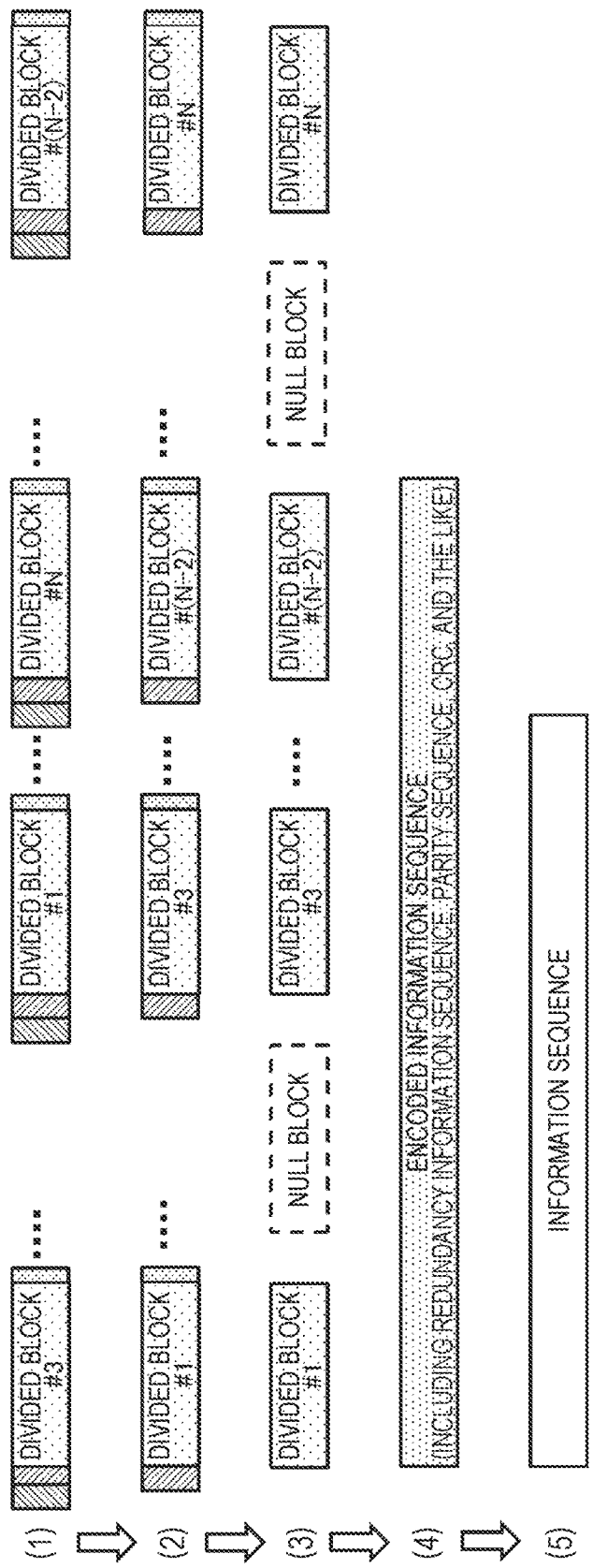
FIG. 20 is a diagram illustrating another example of the depuncturing and the deinterleaving in the upper layer on the reception side (an example of replacing the punctured block with a null block).

FIG. 19 illustrates an example of depuncturing and deinterleaving in the upper layer on the reception side in the communication system according to the present embodiment. Furthermore, FIG. 20 illustrates another example of depuncturing and deinterleaving in the upper layer on the reception side. As illustrated in FIGS. 19 and 20, in the present embodiment, the depuncturing and the deinterleaving are performed in units of divided blocks. However, in the example illustrated in FIG. 19, a dummy block is inserted into a block punctured on the transmission side, but in the example illustrated in FIG. 20, a block depunctured on the transmission side is replaced with a null block. It is to be sufficiently understood that, in any of the examples illustrated in FIGS. 19 and 20, the depuncturing and the deinterleaving are performed in units of blocks after the error correction encoding in the divided upper layer corresponding to the upper layer processing on the transmission side.

Procedures of the depuncturing and the deinterleaving in the upper layer will be described below along (1) to (5) in FIGS. 19 and 20.

(1) The upper layer on the reception side extracts a portion corresponding to the data of the upper layer from the divided block (for example, Transport Block) received from the lower layer, and waits until the number of divided blocks necessary for decoding the upper layer FEC comes up from the lower layer.

(2) The order of the divided blocks is rearranged according to the sequence numbers of the divided blocks among the headers of the FEC information added to the divided blocks (deinterleave processing). For example, the order is rearranged so that the sequence numbers are in ascending order.

(3) In the example illustrated in FIG. 19, a dummy divided block is inserted into a position among the rearranged divided blocks where the sequence number is skipped (for example, a position corresponding to No. 2 in a case where the sequence number is 1, 3, 4, 5, . . . ). Furthermore, a divided block where it is notified that an error has occurred in the lower layer (error correction has not been possible in the lower layer) by a notification from the lower layer may also be replaced with the dummy block. The dummy block may be a block in which all values are 1 or 0 (zero), or may be a block in which 1 and zero are arranged randomly or in a predetermined pattern. Furthermore, the sequence number of the position where the dummy block is inserted is stored and then provided in notification to the upper layer FEC decoder.

On the other hand, in the example illustrated in FIG. 20, among the rearranged divided blocks, a divided block where it is notified that an error has occurred in the lower layer (it has not been possible to perform error correction in the lower layer) by a notification from the lower layer is deleted (replaced with a null block), and a portion where the sequence number is discontinuous may be used as a null block without any change. Also in this case, the sequence number of a null position is stored and then provided in notification to the upper layer FEC decoder.

(4) Information regarding the dummy block or null block and the position of the dummy block or the null block is input to the FEC decoder of the upper layer, and signal processing is performed.

Here, the dummy block is defined as, for example, a block in which all bits are set to 0 or 1. Alternatively, the dummy block may be defined as a block in which 0 and 1 are randomly arranged. Furthermore, the null block is defined as not inputting anything to the decoder. The position where the dummy block or the null block is inserted is a position of the divided block where the error has occurred in the first place, and it has been grasped by the CRC or the error detection technology that the position of the divided block is wrong.

Accordingly, an implementation is also possible in which the corresponding position is not used for decoding on the decoder side. Furthermore, as a merit of using the null block instead of the dummy block, it is possible to save time and effort to generate the dummy block. On the other hand, as a merit of using the dummy block, it is possible to achieve a state in which there is always an input to the decoder (though whether the dummy block is used or not is left aside), and thus it is possible to stabilize the number of states on circuit mounting.

(5) The information sequence of the upper layer is decoded by decoding processing of the upper layer FEC. When no error is detected in the information sequence after decoding, the information sequence after decoding is further transferred to an upper layer. In a case where an error occurs in the information sequence after decoding, a procedure of retransmission control is performed in the upper layer.

C-7. Corresponding Combination of Upper Layer FEC in Communication Device

Table 7 below summarizes situations in which the communication device supports the upper layer FEC and the puncturing.

TABLE 7

| First FEC support category | Category display field value | Support of first FEC | Support of puncturing | Note |
|---|---|---|---|---|
| Communication device category A | 000 | No | No | Corresponding to legacy communication device |
| Communication device category B | 111 | Yes | Yes | Ideal communication device category |
| Communication device category C | 100 | Yes | No | Present embodiment |
| Communication device category D | 110 | Yes | Yes | Present embodiment |
| Communication device category E | 101 | Yes | No | Present embodiment |
| Communication device category F | 011 | No | Yes | Category that should not exist (Processed as exception process or category) |
| Communication device category G | 010 | No | Yes | Category that should not exist (Processed as exception process or category) |
| Communication device category H | 001 | No | N | Category that should not exist (Processed as exception process or category) |

Ideally, the communication device supports both the FEC and the puncturing. On the other hand, the presence or absence of support of the puncturing may vary. For example, there may be a communication device category that does not support or supports only one of puncturing with respect to puncturing in units of bits and puncturing in units of divided blocks.

Note that it can be said that a communication category that does not support the upper layer FEC and supports the puncturing is a category that should not exist (or has no meaning to exist).

Here, the meaning of "supporting the upper layer FEC" desirably indicates that both the encoding (transmission side) and the decoding (reception side) are supported. Furthermore, the meaning of "supporting the upper layer puncturing" also desirably indicates that both the puncturing (transmission side) and the depuncturing (reception side) are supported.

It is desirable that the information of support status of the upper layer FEC is shared between the transmission side communication device and the reception side communication device. In particular, sharing of whether the reception side communication device supports or not with the transmission side communication device relates to determination of whether or not to apply the technology according to the present embodiment. The information regarding the support status is shared, for example, at a connection establishment stage (initial access) before shifting to execution of actual data communication, RRC Connection, handover (handover, hand-off), and handshake.

First Embodiment

Here, an additional embodiment in view of a configuration of a communication system employing the technology proposed in the present description will be described.

D. Case where there is Role Distinction Between Transmission Device and Reception Device As the communication system, there may be a system in which roles of the transmission side communication device and the reception side communication device are substantially equal, and a system in which the roles are different. Examples of the former system in which the roles are substantially equal in transmission and reception include a wireless LAN, Wi-Fi (registered trademark), and the like. Furthermore, examples of the latter system in which the roles are different in transmission and reception can include a cellular system, 4G, long term evolution (LTE), 5G, new radio (NR), a wireless LAN after IEEE 802.11ac, and Wi-Fi (registered trademark). As the transmission-reception relationship in which the roles are different, a base station device (Base Station (BS), eNB, gNB) and a terminal device (User Equipment (UE), Mobile Terminal (MT), and the like), and an access point device (Access Point (AP)) and a station device (Station (STA)) can be mentioned. In this section, for the sake of convenience, an embodiment regarding a system in which the roles are different in transmission and reception will be described by integrating into an example of the base station device and the terminal device.

Figure 21:
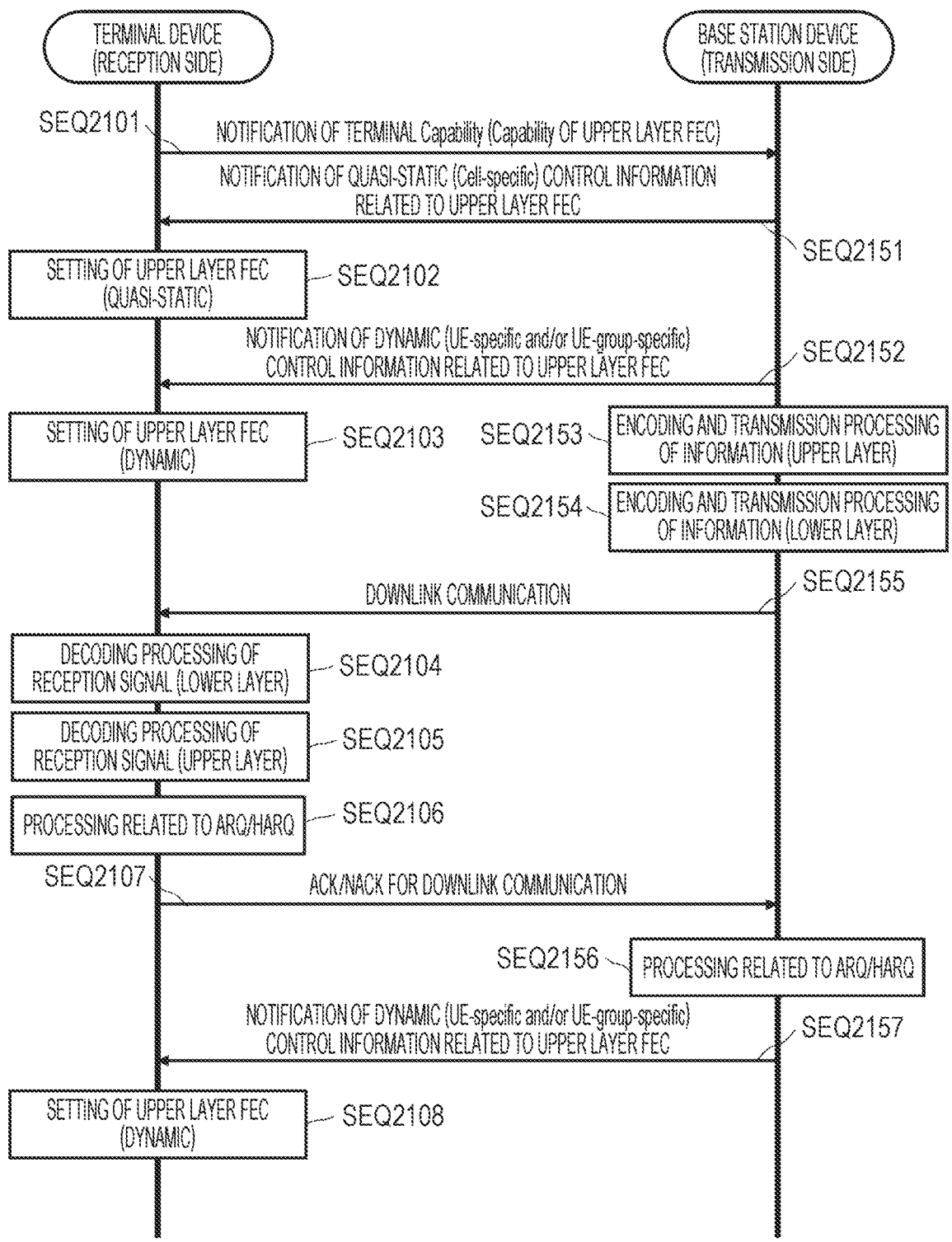
FIG. 21 is a diagram illustrating an example of a procedure of setting the upper layer FEC in downlink.

FIG. 21 illustrates an example of a procedure of setting the upper layer FEC in the downlink. In the downlink, as illustrated, a base station device is the transmission side, and a terminal device connected to a cell of the base station device is the reception side. In this case, it is desirable to notify the terminal device on the reception side of application of the upper layer FEC and specific configuration parameters from the base station device on the transmission side, so as to perform the upper layer FEC.

First, the terminal device notifies the base station device of the cell to which the terminal device itself is connected of information regarding a terminal capability of the terminal device itself (SEQ 2101). The capability information also includes information regarding the capability of the upper layer FEC. The notification of the information regarding the terminal capability is performed during a procedure of initial connection (Initial Access) or after the initial connection. At least one of a random access channel (PRACH), a physical uplink control channel (PUCCH), or a physical uplink chared channel (PUSCH) is used as a physical channel for notification.

The base station device notifies the terminal device connected to the cell managed by the base station device itself of quasi-static control information including the information regarding the upper layer FEC (SEQ 2151). This quasi-static control information may be cell-specific control information. The quasi-static control information may include information regarding whether or not to perform the upper layer FEC and information regarding the type of the upper layer FEC. A notification of this control information is provided during the procedure of the initial connection or after the initial connection. Furthermore, a notification of this control information may be provided as part of RRC procedure, such as RRC signaling and RRC configuration. In addition, a notification of the control information may be periodically provided from the base station device to the terminal device. At least one of a broadcast channel (physical broadcast channel (PBCH)), a downlink control channel (physical downlink control channel (PDCCH), enhanced physical downlink control channel (EPDCCH)), or a downlink shared channel (physical downlink shared channel (PDSCH)) is used as a physical channel for providing a notification of the control information.

The terminal device performs quasi-static setting of the FEC of the terminal device itself on the basis of the quasi-static control information regarding to the upper layer FEC a notification of which is provided from the base station device (SEQ 2102).

Thereafter, in a case where downlink communication specifically occurs from the base station device to the terminal device (for example, a case where the terminal device requests data download (pull), a case where push data to the terminal device is generated, or the like), the base station device notifies the terminal device of control information (dynamic control information) such as a radio resource used for the downlink communication (SEQ 2152). The dynamic control information may be terminal-specific (Use Equipment (UE)-specific) or terminal-group-specific (UE-group-specific) control information. The terminal group mentioned here corresponds to, for example, a group of one or more terminal devices to be transmitted in a case where the downlink communication is multicast or broadcast. Furthermore, the dynamic control information mentioned here includes a frequency resource (for example, a resource block, a subcarrier, a subcarrier group, or the like) for allocating downlink communication to the target terminal device (or terminal group), a time resource (for example, a subframe, a slot, a mini-slot, a symbol, or the like), a spatial resource (for example, an antenna, an antenna port, a spatial layer, a spatial stream, or the like), a non-orthogonal resource (power resource and interleaving pattern) of non-orthogonal multiple access (NOMA), multiuser superposition transmission (MUST), interleave division multiple access (IDMA), or code division multiple access (CDMA), information regarding a modulation level and an FEC encoding rate (modulation and coding set (MCS)) of a lower layer (physical layer), information regarding a coding method and a coding rate of the upper layer FEC (including upper layer puncturing and the like), a setting (New Data Indication (NDI), Redundancy Version (RV), and the like) regarding ARQ/HARQ, and the like.

The terminal device performs setting for preparing for appropriate reception of downlink communication according to the dynamic control information received from the base station device (SEQ 2103).

Thereafter, the base station device performs encoding and modulation processing on data of downlink communication to the terminal device in each of the upper layer and the lower layer so as to conform to the control information a notification of which is provided to the terminal device (SEQ 2153 and SEQ 2154). Then, the base station device transmits the encoded and modulated data to the terminal device as a radio signal (SEQ 2155).

The terminal device performs demodulation and decoding processing on the radio signal from the base station device in each of the lower layer and the upper layer according to the above setting specified by the control information from the base station device (SEQ 2104 and SEQ 2105). Then, the terminal device performs processing related to ARQ/HARQ according to whether the decoding of the data including the upper layer FEC has succeeded or failed (SEQ 2106), and returns ACK or NACK for downlink communication to the base station device (SEQ 2107).

Here, the terminal device desirably changes the setting of processing of the ARQ/HARQ according to whether the decoding of the data including the upper layer FEC has succeeded or failed. For example, in a case where the decoding has failed on the reception side, it is desirable to store the decoding result or data (soft decision value, log likelihood ratio (LLR), and the like) in middle of decoding on the reception side in the memory in order to retransmit and combine the next HARQ on the transmission side.

The base station device executes processing to be performed next according to the ACK/NACK received from the terminal device (SEQ 2156). For example, in a case where the base station device receives a notification of the NACK from the terminal device, the base station device performs preparation for retransmission of ARQ/HARQ. As the preparation for this retransmission include selection of an RV, selection of an MCS, selection of a radio resource, and the like can be mentioned. Furthermore, in a case where the base station device receives a notification of the ACK from the terminal device, since this notification means that transmission and reception of the target data have been performed without any problem, the base station device shifts to communication of next new data without preparation for retransmission as described above.

The base station device shifts to execution of retransmission or downlink communication of new data according to processing of the ARQ/HARQ corresponding to the ACK or NACK received from the terminal device. Thus, the base station device notifies the terminal device of the control information (dynamic control information) such as the radio resource used for the downlink communication again (SEQ 2157). Then, the terminal device performs setting for preparing for appropriate reception of downlink communication (SEQ 2108) according to the dynamic control information received from the base station device, and executes downlink communication according to the setting.

Figure 22:
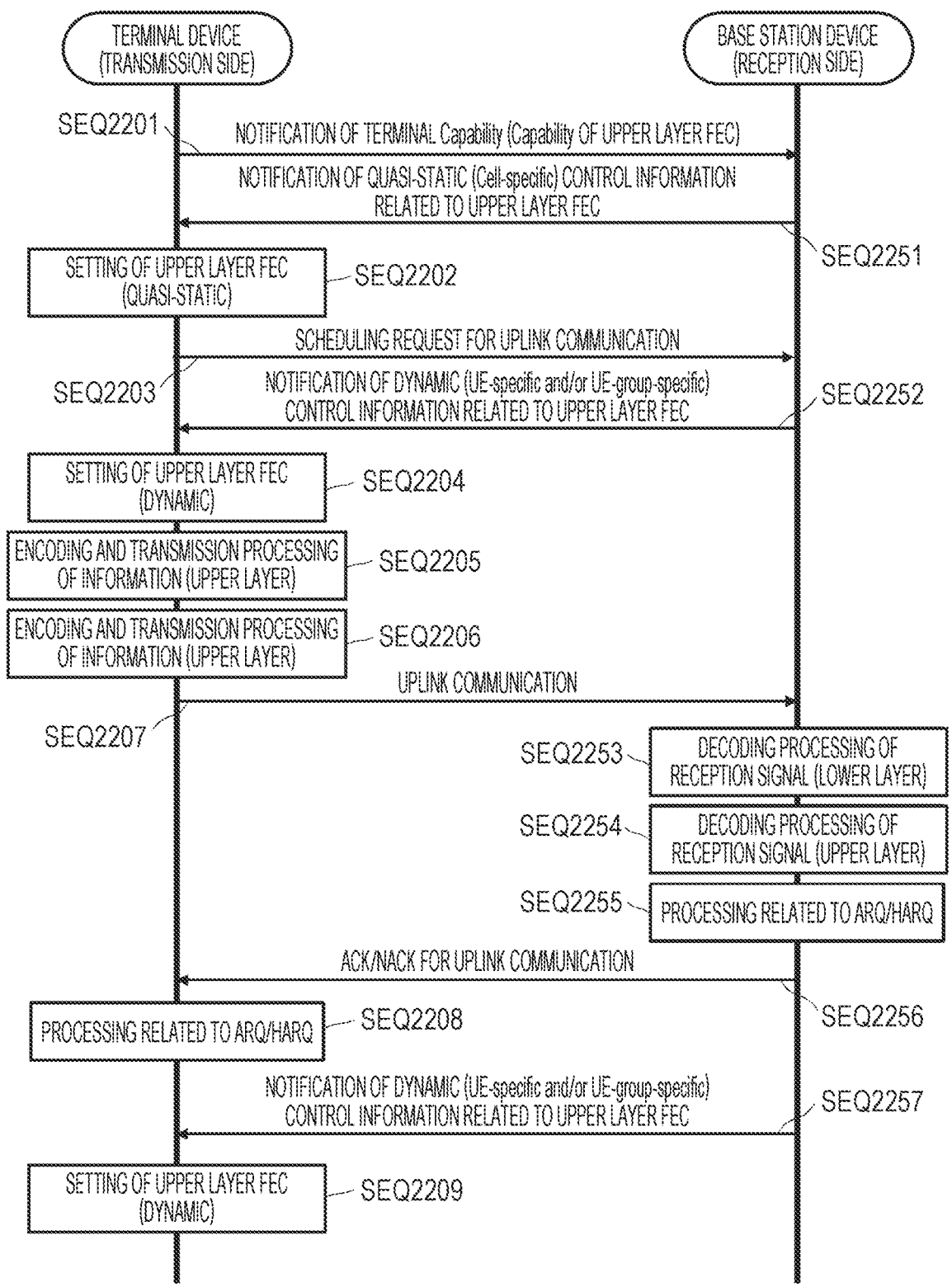
FIG. 22 is a diagram illustrating an example of a procedure of setting the upper layer FEC in uplink.

FIG. 22 illustrates an example of a procedure of setting the upper layer FEC in the uplink. In the uplink, as illustrated, a terminal device is the transmission side, and a base station device of the cell to which the terminal device is connected is the reception side. In this case, it is desirable to notify the terminal device on the transmission side of application of the upper layer FEC and specific configuration parameters from the base station device on the reception side, so as to perform the upper layer FEC.

First, the terminal device notifies the base station device of the cell to which the terminal device itself is connected of information regarding a terminal capability of the terminal device itself (SEQ 2201). The capability information also includes information regarding the capability of the upper layer FEC. The notification of the information regarding the terminal capability is performed during a procedure of initial connection (Initial Access) or after the initial connection. At least one of a random access channel (PRACH), an uplink control channel (PUCCH), or an uplink shared channel (PUSCH) is used as a physical channel for the notification.

The base station device notifies the terminal device connected to the cell managed by the base station device itself of the quasi-static control information including the information regarding the upper layer FEC (SEQ 2251). This quasi-static control information may be cell-specific control information. The quasi-static control information may include information regarding whether or not to perform the upper layer FEC and information regarding the type of the upper layer FEC. A notification of this control information is provided during the procedure of the initial connection or after the initial connection. Furthermore, a notification of this control information may be provided as part of RRC procedure, such as RRC signaling and RRC configuration. In addition, a notification of the control information may be periodically provided from the base station device to the terminal device. At least one of a broadcast channel (PBCH), a downlink control channel (PDCCH, EPDCCH), or a downlink shared channel (PDSCH) is used as a physical channel for providing notification of the control information.

The terminal device performs quasi-static setting of the FEC of the terminal device on the basis of the quasi-static control information regarding the upper layer FEC notification of which is provided from the base station device (SEQ 2202).

Thereafter, in a case where uplink communication specifically occurs from the terminal device to the base station device (for example, a case where the terminal device requests data upload, a case where a request for data is received from another communication device, a case of a notification of periodic state information of the terminal device, or the like), the terminal device notifies the base station device of a scheduling request for uplink communication (SEQ 2203). Thus, the terminal device requests the base station device to allocate a radio resource or the like used for uplink communication.

Upon receiving a scheduling request from the terminal device, the base station device notifies the terminal device of control information (dynamic control information) such as the radio resource used for uplink communication (SEQ 2252). The dynamic control information may be terminal-specific (Use Equipment (UE)-specific) or terminal-group-specific (UE-group-specific) control information. The terminal group mentioned here corresponds to, for example, a group of one or more terminal devices having a common portion in the control information for the uplink communication. Furthermore, the dynamic control information mentioned here includes a frequency resource (for example, a resource block, a subcarrier, a subcarrier group, or the like) for allocating uplink communication to the target terminal device (or terminal group), a time resource (for example, a subframe, a slot, a mini-slot, a symbol, or the like), a spatial resource (for example, an antenna, an antenna port, a spatial layer, a spatial stream, or the like), a non-orthogonal resource (power resource or interleaving pattern) of NOMA, MUST, IDMA, or CDMA, information (MCS) regarding a modulation level and an FEC encoding rate of a lower layer (physical layer), information regarding a coding method and a coding rate of the upper layer FEC (including upper layer puncturing and the like), a setting (NDI, RV, and the like) regarding ARQ/HARQ, and the like.

The terminal device performs setting for preparing for appropriate reception of the uplink communication according to the dynamic control information received from the base station device (SEQ 2204).

Thereafter, the terminal device performs encoding and modulation processing on data of the uplink communication to the terminal device in each of the upper layer and the lower layer so as to conform to the control information a notification of which is provided from the base station device (SEQ 2205 and SEQ 2206). Then, the terminal device transmits the encoded and modulated data to the base station device as a radio signal (SEQ 2207).

The base station device performs demodulation and decoding processing on the radio signal from the terminal device in each of the lower layer and the upper layer according to the above setting specified to the terminal device by the control information (SEQ 2253 and SEQ 2254). Then, the base station device performs processing related to ARQ/HARQ according to whether the decoding of the data including the upper layer FEC has succeeded or failed (SEQ 2255), and returns ACK or NACK for uplink communication to the terminal device (SEQ 2256).

Here, the base station device desirably changes the setting of processing of the ARQ/HARQ according to whether the decoding of the data including the upper layer FEC has succeeded or failed. For example, in a case where the decoding has failed on the reception side, it is desirable to store the decoding result or data (soft decision value, log likelihood ratio (LLR), and the like) in middle of decoding on the reception side in the memory in order to retransmit and combine the next HARQ on the transmission side.

The terminal device executes processing to be performed next according to the ACK/NACK received from the base station device (SEQ 2208). For example, in a case where the terminal device receives a notification of the NACK from the base station device, the terminal device performs preparation for retransmission of ARQ/HARQ. As preparation for this retransmission, for example, waiting for next dynamic control information from the base station device, and the like can be mentioned. Furthermore, in a case where the terminal device receives a notification of the ACK from the base station device, since this notification means that transmission and reception of the target data have been performed without any problem, the terminal device shifts to communication of next new data without preparing for retransmission as described above.

The terminal device shifts to execution of retransmission or uplink communication of new data according to processing of the ARQ/HARQ corresponding to the ACK or NACK received from the base station device. Thus, the base station device notifies the terminal device of the control information (dynamic control information) such as the radio resource used for the uplink communication again (SEQ 2257). Then, the terminal device performs setting for preparing for appropriate reception of the uplink communication according to the dynamic control information received from the base station device (SEQ 2209), and executes the uplink communication according to the setting.

Figure 23:
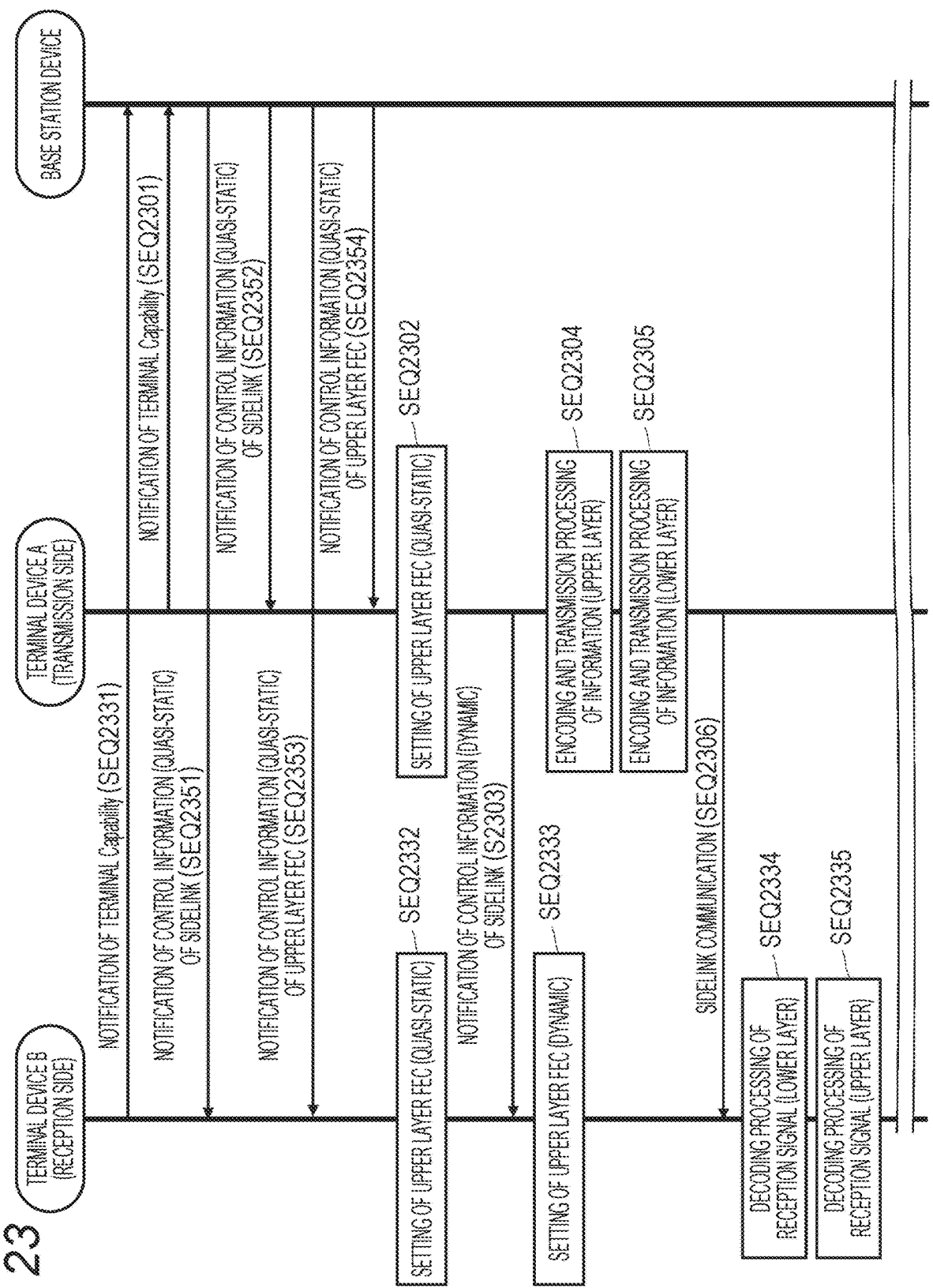
FIG. 23 is a diagram illustrating an example (first half) of a procedure of setting the upper layer FEC in a sidelink between terminal devices.
Figure 24:
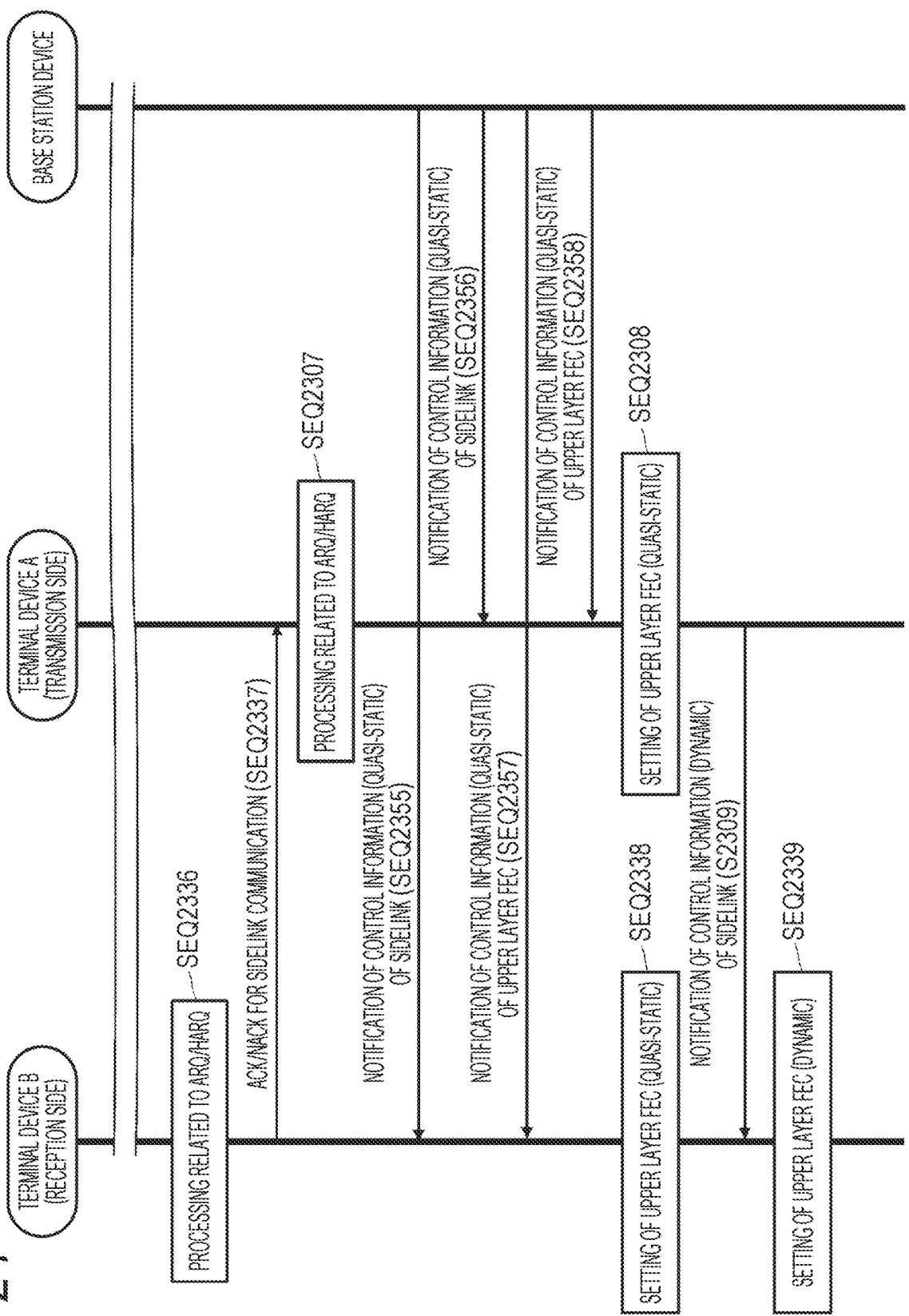
FIG. 24 is a diagram illustrating an example (second half) of a procedure of setting the upper layer FEC in the sidelink between the terminal devices.

FIGS. 23 and 24 illustrate an example of a procedure of setting the upper layer FEC in a sidelink between the terminal devices. In the sidelink, as illustrated, one terminal device A connected to a cell of the base station device is the transmission side, and the other terminal device B connected to the cell of the same base station device is the reception side. In this case, it is desirable to notify the terminal devices A and B of application of the upper layer FEC and specific configuration parameters from the base station device, so as to perform the upper layer FEC.

First, the terminal device B notifies the base station device of the cell to which the terminal device B itself is connected of information regarding a terminal capability of the terminal device B itself (SEQ 2331). Similarly, the terminal device A notifies the base station device of the cell to which the terminal device A itself is connected of information regarding a terminal capability of the terminal device A itself (SEQ 2301). The notification of the information regarding the terminal capability is performed during a procedure of initial connection (Initial Access) or after the initial connection. At least one of a random access channel (PRACH), an uplink control channel (PUCCH), or an uplink shared channel (PUSCH) is used as a physical channel for the notification.

The base station device notifies the terminal devices A and B connected to the cell managed by the base station device itself of the quasi-static control information including information regarding a sidelink radio resource (SEQ 2351 and SEQ 2352). As the quasi-static control information regarding radio resources of the sidelink, designation of frequency resources (for example, a resource block, a subcarrier group, a subcarrier, and the like) and time resources (a radio frame, a subframe, a slot, a mini-slot, a symbol, and the like) of a radio resource pool for the sidelink can be mentioned. A subordinate terminal device may perform sidelink communication using the radio resources within the range of the radio resource pool. It is desirable that the radio resource pool diverts a part of uplink resources of the target cell to the radio resource pool for the sidelink. Alternatively, a part of downlink resources of the target cell may be diverted to the sidelink radio resource pool. Furthermore, the base station device notifies the terminal devices A and B of the quasi-static control information including information regarding the upper layer FEC (SEQ 2353 and SEQ 2354). The quasi-static control information may include information regarding whether or not to perform the upper layer FEC and information regarding the type of the upper layer FEC. A notification of the quasi-static control information regarding radio resources of the sidelink and the quasi-static control information regarding the upper layer FEC may be provided to each of the individual terminal devices A and B as illustrated in the diagram, or may be provided to the terminal devices A and B at the same time.

The quasi-static control information may be cell-specific control information. A notification of these pieces of quasi-static control information is provided during the initial connection procedure or after the initial connection. Furthermore, a notification of this control information may be provided as part of RRC procedure, such as RRC signaling and RRC configuration. Furthermore, a notification of this control information may be periodically provided from the base station device to the terminal devices A and B. At least one of a broadcast channel (PBCH), a downlink control channel (PDCCH, EPDCCH), or a downlink shared channel (PDSCH) is used as a physical channel for providing a notification of the control information.

The terminal devices A and B each perform quasi-static setting of the FECs of the terminal devices A and B themselves on the basis of the quasi-static control information regarding the upper layer FEC a notification of which is provided from the base station device (SEQ 2302 and SEQ 2332).

Thereafter, specifically, when the sidelink communication occurs from the terminal device A to the terminal device B (for example, a case where direct communication between terminal devices occurs, a case where the terminal device A receives a request for direct communication from the terminal device B, or the like), the terminal device A on the transmission side notifies the terminal device B on the reception side of control information (dynamic control information) such as the radio resource used for the sidelink communication (SEQ 2303). The dynamic control information may be terminal-specific (Use Equipment (UE)-specific) or terminal-group-specific (UE-group-specific) control information. The terminal group mentioned here corresponds to, for example, a group of one or more terminal devices to be transmitted in a case where the sidelink communication is multicast or broadcast. Furthermore, the dynamic control information mentioned here includes a frequency resource (for example, a resource block, a subcarrier, a subcarrier group, or the like) for allocating sidelink communication to the target terminal device (or terminal group), a time resource (for example, a subframe, a slot, a mini-slot, a symbol, or the like), a spatial resource (for example, an antenna, an antenna port, a spatial layer, a spatial stream, or the like), a non-orthogonal resource (power resource or interleaving pattern) of NOMA, MUST, IDMA, or CDMA, information (MCS) regarding a modulation level and an FEC encoding rate of a lower layer (physical layer), information regarding a coding method and a coding rate of the upper layer FEC (including upper layer puncturing and the like), a setting (NDI, RV, and the like) regarding ARQ/HARQ, and the like.

The terminal device B on the reception side performs setting for preparation for appropriate reception of the sidelink communication according to the dynamic control information received from the terminal device A on the transmission side (SEQ 2333).

Thereafter, the terminal device A performs encoding and modulation processing on the data of the sidelink communication to the terminal device B in each of the upper layer and the lower layer so as to conform to the control information a notification of which is provided to the terminal device B (SEQ 2304 and SEQ 2305). Then, the terminal device A transmits the encoded and modulated data to the terminal device B as a radio signal (SEQ 2306).

The terminal device B performs demodulation and decoding processing on the radio signal from the terminal device A in each of the lower layer and the upper layer according to the above setting specified by the control information from the terminal device A (SEQ 2334 and SEQ 2335). Then, the terminal device B performs processing related to ARQ/HARQ according to whether the decoding of the data including the upper layer FEC has succeeded or failed (SEQ 2336), and returns ACK or NACK for sidelink communication to the terminal device A (SEQ 2337).

Here, the terminal device B desirably changes the setting of processing of the ARQ/HARQ according to whether the decoding of the data including the upper layer FEC has succeeded or failed. For example, in a case where the decoding has failed on the reception side, it is desirable to store the decoding result or data (soft decision value, log likelihood ratio (LLR), and the like) in middle of decoding in the terminal device B on the reception side in the memory in order to retransmit and combine the next HARQ in the terminal device A on the transmission side.

The terminal device A executes processing to be performed next according to the ACK/NACK received from the terminal device B (SEQ 2307). For example, in a case where the terminal device A receives a notification of the NACK from the terminal device B, the terminal device A performs preparation for retransmission of the ARQ/HARQ. As preparation for this retransmission, waiting for next dynamic control information, and the like can be mentioned. Furthermore, in a case where the terminal device A receives a notification of the ACK from the terminal device B, since this notification means that transmission and reception of the target data have been performed without any problem, the terminal device A shifts to a scheduling request for communication of next new data without preparing for retransmission as described above.

The terminal device A shifts to execution of retransmission or sidelink communication of new data according to processing of the ARQ/HARQ corresponding to the ACK or NACK received from the terminal device B.

The base station device notifies the terminal devices A and B of quasi-static control information including the information regarding the sidelink radio resource again (SEQ 2355 and SEQ 2356), and notifies the terminal devices A and B of quasi-static control information including the information regarding the upper layer FEC again (SEQ 2357 and SEQ 2358). Then, the terminal devices A and B each perform quasi-static setting of the FEC of each of the terminal devices A and B themselves on the basis of the quasi-static control information regarding the upper layer FEC a notification of which is provided from the base station device (SEQ 2308 and SEQ 2338).

Next, the terminal device A notifies the terminal device B of the control information (dynamic control information) such as the radio resource used for the sidelink communication again (SEQ 2309). Then, the terminal device B performs setting for preparation for appropriate reception of the sidelink communication according to the dynamic control information received from the terminal device A (SEQ 2339), and executes the sidelink communication according to the setting.

E. Case where Transmission Device and Reception Device are Substantially Equal in Role Examples of a system in which roles are substantially equal in transmission and reception include a wireless LAN, Wi-Fi (registered trademark), and the like (described above). In this section, an embodiment regarding the system in which the roles are substantially equal in transmission and reception will be described.

Figure 25:
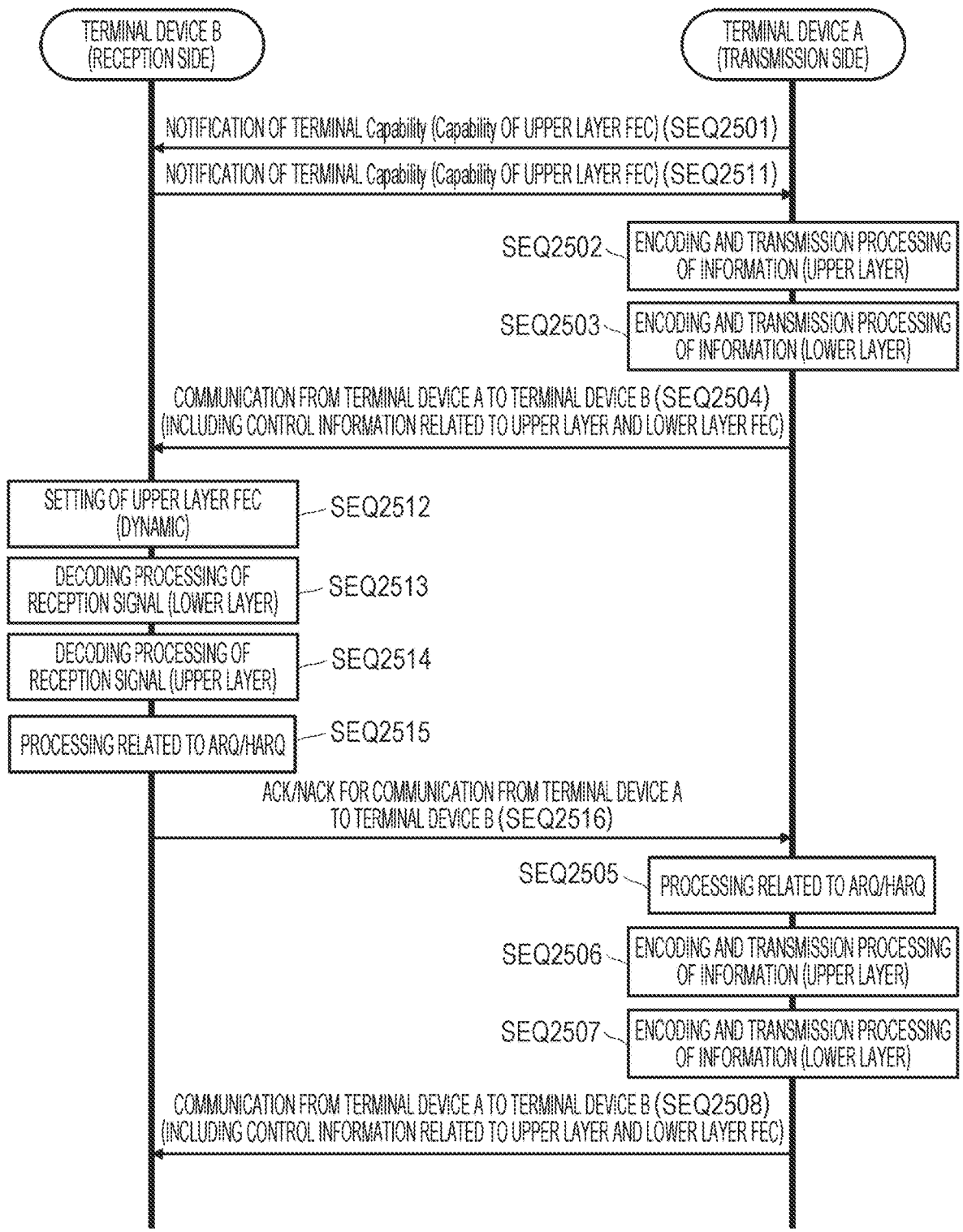
FIG. 25 is a diagram illustrating an example of a procedure of setting the upper layer FEC in a communication system in which roles are substantially equal in transmission and reception.

FIG. 25 illustrates an example of a procedure of setting the upper layer FEC in a communication system in which the roles are substantially equal in transmission and reception. As illustrated, the terminal device A is the transmission side, and the terminal device B is the reception side.

The terminal device A notifies the terminal device B, which is a substantially equal communication partner, of information regarding a terminal capability of the terminal device A itself (SEQ 2501). The capability information also includes information regarding the capability of the upper layer FEC. Similarly, the terminal device B notifies the terminal device A of information regarding a terminal capability of the terminal device B itself (SEQ 2511). A notification of the terminal capability information can be provided, for example, by including the capability information in a beacon signal.

In a case where data transmission to the terminal device B occurs in the terminal device A, the terminal device A performs encoding and modulation processing on data to be transmitted in each of the upper layer and the lower layer according to the capabilities of the terminal device A and the terminal device B (SEQ 2502 and SEQ 2503).

Figure 26:
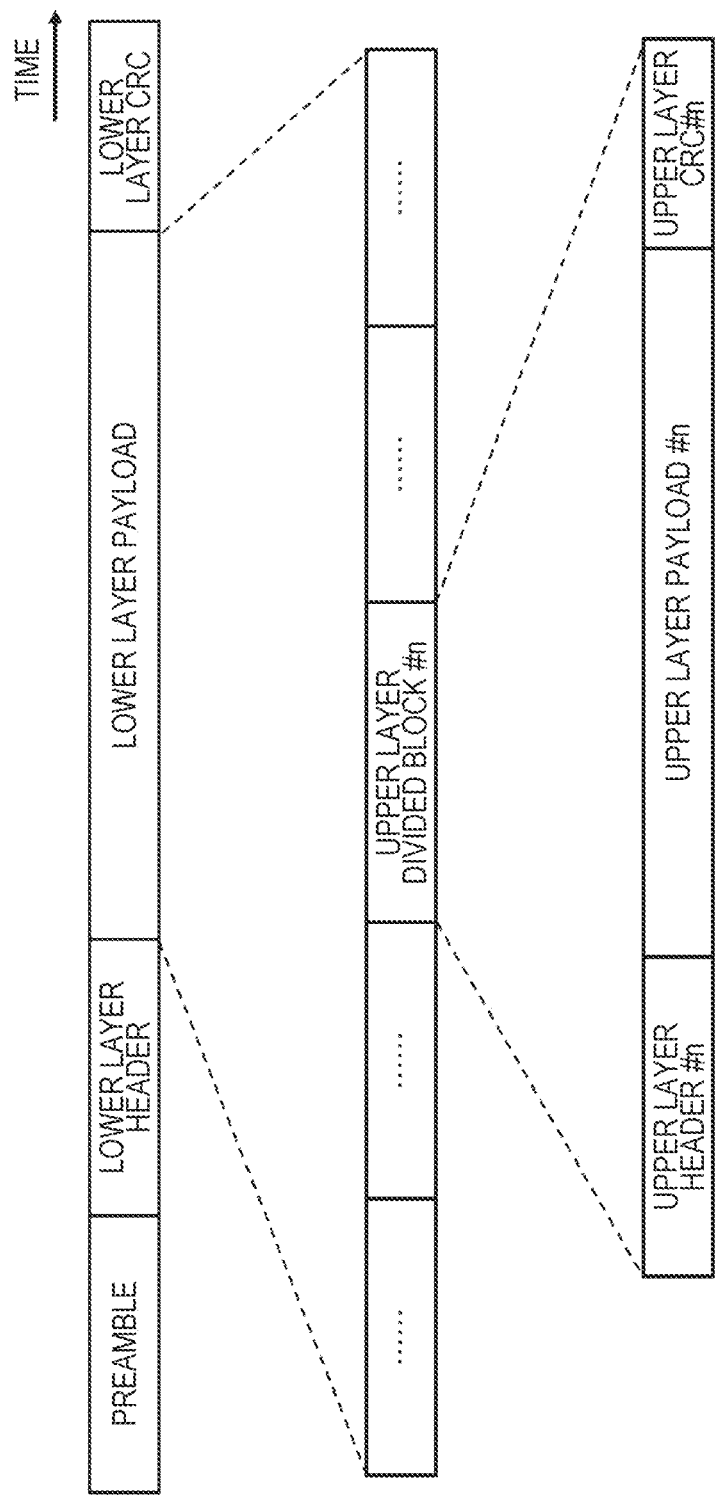
FIG. 26 is a diagram illustrating a configuration example of a lower layer packet.

Then, the terminal device A transmits the encoded and modulated data to the terminal device B as a radio signal (SEQ 2504). As illustrated in FIG. 26, the radio signal includes parts of a lower layer preamble, a lower layer header, a lower layer payload, and a lower layer CRC as a lower layer packet (or a lower layer frame).

The dynamic control information of the lower layer of the MCS, the FEC encoding, a frequency resource (a resource block, a subcarrier group, a subcarrier, or the like), and a time resource (the lower layer frame length (the number of symbols), or the like) spatial resource (an antenna, an antenna port, a spatial layer, a spatial stream, or the like) of the lower layer are included as the lower layer preamble. It is desirable that the dynamic control information of the lower layer is valid only for the lower layer packet. The lower layer payload further includes one or more divided blocks (corresponding to the divided block and the coding block described above). The divided block includes an upper layer header (including upper layer FEC information), an upper layer payload, and an upper layer CRC.

Upon receiving the radio signal (lower layer packet) from the terminal device A, the terminal device B decodes the lower layer header, acquires dynamic control information necessary for demodulating and decoding the lower layer payload, and sets the dynamic control information in itself (SEQ 2512).

The terminal device B performs demodulation and decoding processing of the lower layer payload on the basis of the dynamic control information of the lower layer (SEQ 2513). Then, after demodulating and decoding the payload of the lower layer, the terminal device B performs decoding (decode upper layer FEC, including interleaving and deinterleaving) of the divided block of the upper layer (SEQ 2514).

When the decoding including the upper layer FEC is completed, the terminal device B performs processing related to ARQ/HARQ (SEQ 2515) according to whether the decoding of data including the upper layer FEC has succeeded or failed, and performs or updates the setting related to ARQ/HARQ. Then, the terminal device B returns ACK or NACK to the terminal device A according to whether the decoding of data has succeeded or failed (SEQ 2516).

The terminal device A executes processing of ARQ/HARQ corresponding to the ACK/NACK received from the terminal device B (SEQ 2505). Then, the terminal device A shifts to retransmission or new data transmission processing according to the processing of the ARQ/HARQ. That is, the terminal device A performs encoding and modulation processing on data to be transmitted in each of the upper layer and the lower layer (SEQ 2506 and SEQ 2507), and transmits the encoded and modulated data to the terminal device B as a radio signal (SEQ 2508).

Finally, effects of the technology proposed in the present description will be described.

According to the technology proposed in the present description, the amount of data to be transmitted in the physical layer (or the lower layer) can be reduced by introducing the FEC code of the upper layer into the communication system and applying puncturing in the upper layer. Furthermore, according to the technology proposed in the present description, even in a situation where an error or a delay occurs in the physical layer, decoding in the upper layer is possible. Thus, retransmission can be suppressed, and low delay and high reliability can be suppressed.

INDUSTRIAL APPLICABILITY

The technology disclosed herein has been described in detail with reference to the specific embodiments. However, it is obvious that those skilled in the art can modify or substitute the embodiment without departing from the gist of the technology disclosed herein.

The technology disclosed in the present description can be applied to, for example, any of communication systems in which roles are substantially equal in transmission and reception such as wireless LAN and Wi-Fi (registered trademark), and communication systems having different roles in transmission and reception such as cellular system, 4G, LTE, 5G, NR, and wireless LAN and Wi-Fi of IEEE 802.11ac or later, and the like.

In short, the technology disclosed herein has been described by way of example, and the contents of the description herein should not be interpreted restrictively. In order to determine the gist of the technology disclosed herein, the claims should be considered.

Note that the technology disclosed herein may have the following configurations.

(1) A communication device including:

an acquisition unit that acquires control information regarding forward error correction (FEC) of an upper layer and control information regarding FEC of a lower layer;

an encoding-decoding unit that performs error correction encoding or decoding of an information sequence in the upper layer according to control information regarding the FEC of the upper layer; and a puncturing processing unit that performs puncturing or depuncturing in the upper layer.

(2) The communication device according to (1) above, further including a division processing unit that divides the information sequence of the upper layer into blocks or concatenates blocks.

(3) The communication device according to (2) above, in which the division processing unit divides the information sequence before the error correction encoding in the upper layer, and the encoding-decoding unit performs the error correction encoding in the upper layer on each of the blocks after dividing.

(4) The communication device according to (2) above, in which the division processing unit divides the information sequence after the error correction encoding in the upper layer.

(5) The communication device according to any one of (2) to (4) above, in which the puncturing processing unit performs the puncturing or the depuncturing in units of the divided blocks.

(5-1) The communication device according to (5) above, in which the puncturing processing unit inserts a dummy block into a punctured block, or inserts a dummy block into the punctured block and performs the depuncturing.

(5-2) The communication device according to (5-1) above, in which the dummy block is a block in which all bits are set to 0 or 1 or a block in which 0 and 1 are randomly arranged.

(5-3) The communication device according to (5) above, in which the puncturing processing unit performs the puncturing or the depuncturing in units of the blocks after the error correction encoding in the divided upper layer.

(6) The communication device according to any one of (2) to (5) above, in which a sequence number related to an order of blocks is added to each of the divided blocks.

(7) The communication device according to any one of (2) to (6) above, further including
an interleave processing unit that performs interleaving or deinterleaving in the upper layer in units of the divided blocks.

(7-1) The communication device according to (7) above, in which
the puncturing processing unit performs the interleaving or the deinterleaving in units of the blocks after the error correction encoding in the divided upper layer.

(8) The communication device according to any one of (2) to (7) above, in which
the division processing unit performs division of an information sequence of the upper layer into blocks on the basis of a relationship between a data size of the information sequence and a data size of the blocks after dividing.

(9) The communication device according to any one of (1) to (8) above, in which
the communication device operates as a terminal device connected to a cell of a base station device, and
the acquisition unit acquires control information regarding the FEC of the upper layer from the base station device.

(10) The communication device according to (9) above, further including
a notification unit that notifies the base station device of capability information regarding the FEC of the upper layer of the communication device itself.

(11) The communication device according to (9) or (10) above, in which
the acquisition unit receives the information regarding the FEC of the upper layer in two stages.

(12) The communication device according to (11) above, in which
the acquisition unit acquires at least one of information regarding presence or absence of performing of the upper layer FEC or information regarding a type of the upper layer FEC in a first stage, and acquires at least one of information regarding a coding rate of the upper layer FEC or information regarding presence or absence of performing of upper layer puncturing in a second stage.

(13) The communication device according to any one of (1) to (12) above, in which
the control information regarding the FEC of the upper layer is associated with setting of a radio resource pool.

(14) The communication device according to any one of (1) to (13) above, in which
the setting of the FEC of the upper layer is associated with at least one of a bearer (bearer type) of a target information sequence or a communication quality class.

(15) The communication device according to any one of (1) to (14) above, in which
the upper layer is any one of a data link layer, a media access control (MAC) layer, a radio link control (RLC) layer, a packet data convergence protocol (PDCP) layer, and a second layer, and
the lower layer is any one of a physical layer, a physical (PHY) layer, and a first layer.

(16) The communication device according to any one of (1) to (15) above, in which
the FEC of the upper layer is any one of an erasure correction code, a rate-less code, a Raptor code, and a RaptorQ code.

(17) The communication device according to any one of (1) to (16) above, in which
the FEC of the lower layer is either a low density parity-check (LDPC) code or a polar code.

(18) The communication device according to any one of (1) to (17) above, further including
a determination unit that determines whether or not to perform FEC encoding of the upper layer.

(19) The communication device according to (18) above, in which
the determination unit determines whether or not to perform FEC encoding of the upper layer on the basis of at least one of a status of a reception side communication device, an application of a target information sequence, or a status of the target information sequence.

(20) A communication method including:
an acquisition step of acquiring control information regarding forward error correction (FEC) of an upper layer and control information regarding FEC of a lower layer;
an encoding-decoding step of performing error correction encoding or decoding of an information sequence in the upper layer according to control information regarding the FEC of the upper layer; and
a puncturing processing step of performing puncturing or depuncturing in the upper layer.

REFERENCE SIGNS LIST

301 Upper layer FEC encoding unit
302 Upper layer frame formation processing unit
303 Lower layer FEC encoding unit
304 Lower layer frame formation processing unit
401 Lower layer reception processing unit
402 Lower layer FEC decoding unit
403 Upper layer reception processing unit
404 Upper layer FEC decoding unit

The invention claimed is:
1. A communication device comprising:
an acquisition unit that acquires control information regarding forward error correction (FEC) of an upper layer and control information regarding FEC of a lower layer;
an encoding-decoding unit that performs error correction encoding or decoding of an information sequence in the upper layer according to the control information regarding the FEC of the upper layer; and
a puncturing processing unit that performs puncturing or depuncturing in the upper layer.

2. The communication device according to claim 1, further comprising
a division processing unit that divides the information sequence of the upper layer into blocks or concatenates blocks.

3. The communication device according to claim 2, wherein
the division processing unit divides the information sequence before the error correction encoding in the upper layer, and
the encoding-decoding unit performs the error correction encoding in the upper layer on each of the blocks after dividing.

4. The communication device according to claim 2, wherein
the division processing unit divides the information sequence after the error correction encoding in the upper layer.

5. The communication device according to claim 2, wherein
the puncturing processing unit performs the puncturing or the depuncturing in units of the divided blocks.

6. The communication device according to claim 2, wherein
a sequence number related to an order of blocks is added to each of the divided blocks.

7. The communication device according to claim 2, further comprising
an interleave processing unit that performs interleaving or deinterleaving in the upper layer in units of the divided blocks.

8. The communication device according to claim 2, wherein
the division processing unit performs division of an information sequence of the upper layer into blocks on a basis of a relationship between a data size of the information sequence and a data size of the blocks after dividing.

9. The communication device according to claim 1, wherein
the communication device operates as a terminal device connected to a cell of a base station device, and
the acquisition unit acquires control information regarding the FEC of the upper layer from the base station device.

10. The communication device according to claim 9, further comprising
a notification unit that notifies the base station device of capability information regarding the FEC of the upper layer of the communication device itself.

11. The communication device according to claim 9, wherein the acquisition unit receives the control information regarding the FEC of the upper layer in two stages.

12. The communication device according to claim 11, wherein
the acquisition unit acquires at least one of information regarding presence or absence of performing of the upper layer FEC or information regarding a type of the upper layer FEC in a first stage, and acquires at least one of information regarding a coding rate of the upper layer FEC or information regarding presence or absence of performing of upper layer puncturing in a second stage.

13. The communication device according to claim 1, wherein
the control information regarding the FEC of the upper layer is associated with setting of a radio resource pool.

14. The communication device according to claim 1, wherein setting of the FEC of the upper layer is associated with at least one of a bearer (bearer type) of a target information sequence or a communication quality class.

15. The communication device according to claim 1, wherein
the upper layer is any one of a data link layer, a media access control (MAC) layer, a radio link control (RLC) layer, a packet data convergence protocol (PDCP) layer, and a second layer, and
the lower layer is any one of a physical layer, a physical (PHY) layer, and a first layer.

16. The communication device according to claim 1, wherein
the FEC of the upper layer is any one of an erasure correction code, a rate-less code, a Raptor code, and a RaptorQ code.

17. The communication device according to claim 1, wherein
the FEC of the lower layer is either a low density parity-check (LDPC) code or a polar code.

18. The communication device according to claim 1, further comprising
a determination unit that determines whether or not to perform FEC encoding of the upper layer.

19. The communication device according to claim 18, wherein
the determination unit determines whether or not to perform the FEC encoding of the upper layer on a basis of at least one of a status of a reception side communication device, an application of a target information sequence, or a status of the target information sequence.

20. A communication method, comprising:
an acquisition step of acquiring control information regarding forward error correction (FEC) of an upper layer and control information regarding FEC of a lower layer;
an encoding-decoding step of performing error correction encoding or decoding of an information sequence in the upper layer according to the control information regarding the FEC of the upper layer; and
a puncturing processing step of performing puncturing or depuncturing in the upper layer.

* * * * *